(12) United States Patent
Park et al.

(10) Patent No.: US 12,394,379 B2
(45) Date of Patent: Aug. 19, 2025

(54) LIGHT EMITTING DIODE DISPLAY DEVICE

(71) Applicant: SAMSUNG DISPLAY CO., LTD., Yongin-si (KR)

(72) Inventors: Jun Hyun Park, Suwon-si (KR); Jang Mi Kang, Seoul (KR); Hyun Joon Kim, Hwaseong-si (KR); Hae Min Kim, Gumi-si (KR); Min Jae Jeong, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/780,398

(22) Filed: Jul. 22, 2024

(65) Prior Publication Data

US 2024/0381723 A1    Nov. 14, 2024

Related U.S. Application Data

(63) Continuation of application No. 18/362,933, filed on Jul. 31, 2023, now Pat. No. 12,048,214, which is a (Continued)

(30) Foreign Application Priority Data

Sep. 25, 2020 (KR) .................. 10-2020-0124979

(51) Int. Cl.
| | |
|---|---|
| *G09G 3/3233* | (2016.01) |
| *H10K 50/813* | (2023.01) |
| *H10K 59/122* | (2023.01) |
| *H10K 59/131* | (2023.01) |
| *H10K 59/35* | (2023.01) |
| *H10K 59/80* | (2023.01) |

(52) U.S. Cl.
CPC ......... *G09G 3/3233* (2013.01); *H10K 50/813* (2023.02); *H10K 59/122* (2023.02); *H10K 59/352* (2023.02); *H10K 59/80515* (2023.02); *G09G 2300/0452* (2013.01); *G09G 2300/0809* (2013.01); *H10K 59/131* (2023.02); *H10K 59/80516* (2023.02); *H10K 59/80522* (2023.02)

(58) Field of Classification Search
CPC .. G09G 3/3233; G09G 3/3258; H10K 59/122; H10K 59/352; H10K 59/80515; H10K 59/131; H10K 50/813
See application file for complete search history.

(56) References Cited

U.S. PATENT DOCUMENTS

| | | |
|---|---|---|
| 10,755,647 B2 | 8/2020 | Kim et al. |
| 11,043,189 B2 | 6/2021 | Choi et al. |
| | (Continued) | |

FOREIGN PATENT DOCUMENTS

| | | |
|---|---|---|
| KR | 10-1820032 B1 | 1/2018 |
| KR | 10-2018-0046865 A | 5/2018 |
| | (Continued) | |

*Primary Examiner* — Sardis F Azongha
(74) *Attorney, Agent, or Firm* — Womble Bond Dickinson (US) LLP

(57) ABSTRACT

A light emitting diode display device includes: a pixel circuit; a data line connected to the pixel circuit to transmit a data voltage; an anode on the pixel circuit and the data line; an emission layer on the anode; and a cathode on the emission layer. The anode includes a first anode and a second anode, and the data line extends across the first anode and the second anode.

20 Claims, 13 Drawing Sheets

Related U.S. Application Data continuation of application No. 17/307,859, filed on May 4, 2021, now Pat. No. 11,716,883.

(56) References Cited

U.S. PATENT DOCUMENTS

| | | |
|---|---|---|
| 2018/0374419 A1 | 12/2018 | Chen et al. |
| 2019/0096335 A1 | 3/2019 | Kim et al. |
| 2021/0183900 A1 | 6/2021 | Choi et al. |

FOREIGN PATENT DOCUMENTS

| | | |
|---|---|---|
| KR | 10-2019-0036579 A | 4/2019 |
| KR | 10-2086404 B1 | 3/2020 |
| KR | 10-2020-0039891 A | 4/2020 |
| KR | 10-2020-0040321 A | 4/2020 |
| KR | 10-2020-0070512 A | 6/2020 |
| KR | 10-2020-0077677 A | 7/2020 |

LIGHT EMITTING DIODE DISPLAY DEVICE

CROSS-REFERENCE TO RELATED APPLICATIONS

This application is a continuation of U.S. patent application Ser. No. 18/362,933, filed Jul. 31, 2023, which is a continuation of U.S. patent application Ser. No. 17/307,859, filed May 4, 2021, now U.S. Pat. No. 11,716,883, which claims priority to and the benefit of Korean Patent Application No. 10-2020-0124979, filed Sep. 25, 2020, the entire content of all of which is incorporated herein by reference.

BACKGROUND

1. Field

Aspects of one or more embodiments of the present disclosure relate to a light emitting diode display device.

2. Description of the Related Art

A display device is a device that displays a screen, and includes a liquid crystal display (LCD) and an organic light emitting diode (OLED) display. The display device is used in various suitable electronic devices, for example, such as a mobile phone, a navigation device, a digital camera, an electronic book, a portable game machine, and various terminals.

The organic light emitting diode display has a self-luminance characteristic, and does not require a separate light source, unlike a liquid crystal display, such that a thickness and a weight of the organic light emitting diode display may be decreased. In addition, because the organic light emitting diode display exhibits high grade characteristics, for example, such as low power consumption, high luminance, rapid response, and the like, the organic light emitting diode display has been prominent as the next generation display. In addition, recent display devices are generally being developed to have a high resolution.

The above information disclosed in this Background section is for enhancement of understanding of the background of the present disclosure, and therefore, it may contain information that does not constitute prior art.

SUMMARY

One or more embodiments of the present disclosure are directed to a light emitting diode display device, which may be capable of high-speed driving by reducing a parasitic capacitance therein.

According to one or more embodiments of the present disclosure, a light emitting diode display device includes: a pixel circuit; a data line connected to the pixel circuit to transmit a data voltage; an anode on the pixel circuit and the data line; an emission layer on the anode; and a cathode on the emission layer. The anode includes a first anode and a second anode, and the data line extends across the first anode and the second anode.

In an embodiment, the data line may not overlap with the first anode and the second anode in a plan view.

In an embodiment, the first anode and the second anode may have different areas from each other.

In an embodiment, the first anode and the second anode may be electrically connected to each other by an anode connection; and the anode connection may overlap with the data line in a plan view.

In an embodiment, the light emitting diode display device may further include a red pixel, a green pixel, and a blue pixel, and the pixel circuit may include a plurality of pixel circuits, each of the red pixel, the green pixel, and the blue pixel including a corresponding pixel circuit from among the plurality of pixel circuits. The anode may include a red pixel anode connected to the pixel circuit of the red pixel, a green pixel anode connected to the pixel circuit of the green pixel, and a blue pixel anode connected to the pixel circuit of the blue pixel. One anode from among the red pixel anode, the green pixel anode, and the blue pixel anode may not overlap with the data line, and may have the largest area from among those of the red pixel anode, the green pixel anode, and the blue pixel anode.

In an embodiment, the one anode that does not overlap with the data line may be the blue pixel anode; and the data line that does not overlap with the blue pixel anode may be connected to the pixel circuit of the blue pixel.

In an embodiment, the light emitting diode display device may further include a partition wall having an opening exposing the one anode, and a part of the one anode may not be exposed by the opening of the partition wall.

In an embodiment, the part of the one anode may extend in a direction crossing an extending direction of the data line.

According to one or more embodiments of the present disclosure, a light emitting diode display device includes: a pixel circuit; a data line connected to the pixel circuit, and configured to transmit a data voltage; a common voltage line connected to the pixel circuit, and extending in the same direction as that of the data line; an anode on the data line and the common voltage line; an emission layer on the anode; and a cathode on the emission layer. The anode does not overlap with the common voltage line.

In an embodiment, the common voltage line may be configured to apply a voltage to the pixel circuit, and may include one from among a bias voltage line, a reference voltage line, a driving voltage line, a driving low voltage line, and an initialization voltage line.

In an embodiment, the pixel circuit may include: a driving transistor configured to transmit an output current to the anode; an input capacitor; and a second transistor connected to the data line, and configured to transmit the data voltage to the input capacitor. The reference voltage line may be configured to transmit a reference voltage to a node to which the input capacitor and the second transistor are connected to each other; the driving voltage line may be configured to transmit a driving voltage to the driving transistor; the bias voltage line may be configured to transmit a bias voltage to the driving transistor; the driving low voltage line may be configured to transmit a driving low voltage to the cathode; and the initialization voltage line may be configured to transmit an initialization voltage to the anode.

In an embodiment, the common voltage line may be the initialization voltage line.

In an embodiment, the common voltage line may be the driving low voltage line.

In an embodiment, the anode may include a first anode and a second anode; and the data line may extend between the first anode and the second anode in a plan view.

In an embodiment, the first anode and the second anode may have different areas from each other.

In an embodiment, the first anode and the second anode may be electrically connected to each other by an anode connection; and the anode connection may overlap with the data line in a plan view.

In an embodiment, the light emitting diode display device may further include a red pixel, a green pixel, and a blue pixel, and the pixel circuit may include a plurality of pixel circuits, each of the red pixel, the green pixel, and the blue pixel including a corresponding pixel circuit from among the plurality of pixel circuits. The anode may include a red pixel anode connected to the pixel circuit of the red pixel, a green pixel anode connected to the pixel circuit of the green pixel, and a blue pixel anode connected to the pixel circuit of the blue pixel, and one anode from among the red pixel anode, the green pixel anode, and the blue pixel anode may not overlap with the data line, and may have the largest area from among those of the red pixel anode, the green pixel anode, and the blue pixel anode.

In an embodiment, the one anode that does not overlap with the data line may be the blue pixel anode; and the data line that does not overlap with the blue pixel anode may be connected to the pixel circuit of the blue pixel.

In an embodiment, the light emitting diode display device may further include a partition wall including an opening exposing the one anode, and a part of the one anode may not be exposed by the opening of the partition wall.

In an embodiment, the part of the one anode may extend in a direction crossing an extending direction of the data line.

According to one or more embodiments of the present disclosure, high-speed driving may be possible by reducing the parasitic capacitance between the anode and the data line. The parasitic capacitance between the anode and the data line (e.g., a specific data line), which may be difficult to drive at high speed due to the high parasitic capacitance, may be reduced, and thus, high-speed driving of the entire display device may be enabled. In addition, according to one or more embodiments of the present disclosure, the parasitic capacitance between the anode and the voltage line is also reduced, thereby indirectly reducing the parasitic capacitance of the data line. Accordingly, high-speed driving of the display device may be possible.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
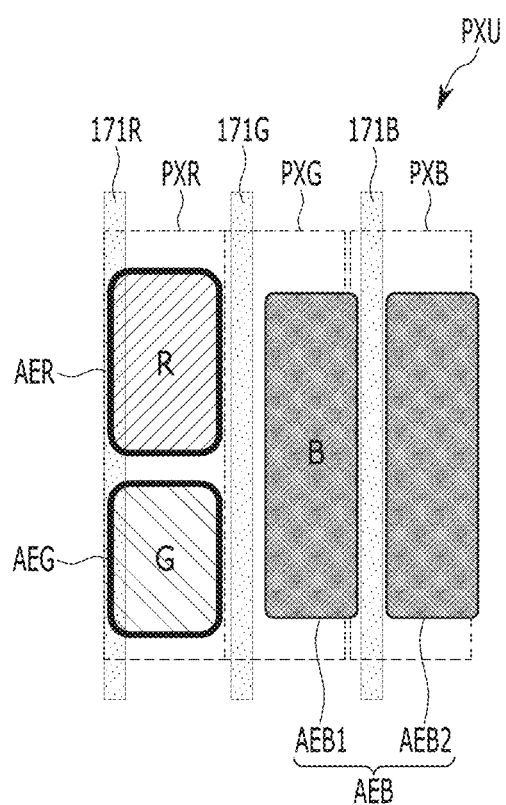
FIG. 1 is a schematic diagram showing an arrangement of an element in a pixel of a light emitting diode display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below, and does not necessarily refer to being positioned on the upper side of the object portion based on a gravitational direction. The device may be otherwise oriented (e.g., rotated 90 degrees or at other orientations) and the spatially relative descriptors used herein should be interpreted accordingly.

As used in the specification, the phrase "in a plan view" refers to a view of an object portion from above, and the phrase "in a cross-sectional view" refers to a view of an object portion from the side when a cross-section is taken by vertically cutting the object portion.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Hereinafter, a schematic structure of a light emitting diode display device according to an embodiment of the present disclosure is described with reference to FIG. 1.

FIG. 1 is a schematic diagram showing an arrangement of an element in a pixel of a light emitting diode display device according to an embodiment.

An example of the light emitting diode display device is described based on an organic light emitting display device. The organic light emitting display device includes a plurality of pixels, and the plurality of pixels are divided into a unit pixel PXU.

The unit pixel PXU may include pixels of three primary colors, and for an example, the unit pixel PXU is shown in FIG. 1 as including a red pixel, a green pixel, and a blue pixel.

One unit pixel PXU includes pixel circuit units (e.g., pixel circuits) PXR, PXG, and PXB, and light-emitting element units (e.g., light-emitting elements) electrically connected to respective pixel circuit units PXR, PXG, and PXB.

The light emitting diode display device according to an embodiment may include: the pixel circuit units PXR, PXG, and PXB; data lines 171R, 171G, and 171B connected to the pixel circuit units PXR, PXG, and PXB for transmitting a data voltage; an anode disposed on the data lines 171R, 171G, and 171B; an emission layer disposed on the anode; and a cathode disposed on the emission layer. Here, the anode, the emission layer, and the cathode constitute the light-emitting element unit (e.g., a light-emitting element).

The pixel circuit units PXR, PXG, and PXB are parts for applying a current to the anodes AER, AEG, and AEB of the light-emitting element unit based on a signal applied from the outside. The light-emitting element unit is disposed on the pixel circuit units PXR, PXG, and PXB, and includes the anodes AER, AEG, and AEB, an organic emission layer, and a cathode.

In the organic emission layer, the current output by the pixel circuit unit flows, and a degree to which the organic emission layer emits light changes according to the magnitude of the current. The organic emission layer includes an organic light emitting material, and when being combined with moisture, the organic light emitting material may have a drawback of low efficiency. Accordingly, the side and top surfaces of the pixel circuit unit and the light-emitting element unit are sealed with an encapsulation layer, so that moisture does not penetrate from the outside. The encapsulation layer may have a structure including a plurality of layers including one or more organic layers and one or more inorganic layers, and may include a triple layer structure, for example, including an inorganic layer, an organic layer, and an inorganic layer.

In FIG. 1, the pixel circuit units PXR, PXG, and PXB are shown by dotted lines, and a plurality of transistors and capacitors are formed in the corresponding dotted line region in a plan view (e.g., a view from a direction that is perpendicular to or substantially perpendicular to a surface (e.g., a top surface) of the relevant element or layer).

Each of the pixel circuit units PXR, PXG, and PXB is connected to a plurality of signal lines, and the data lines 171R, 171G, and 171B from among the plurality of signal lines are shown in FIG. 1.

Figure 11:
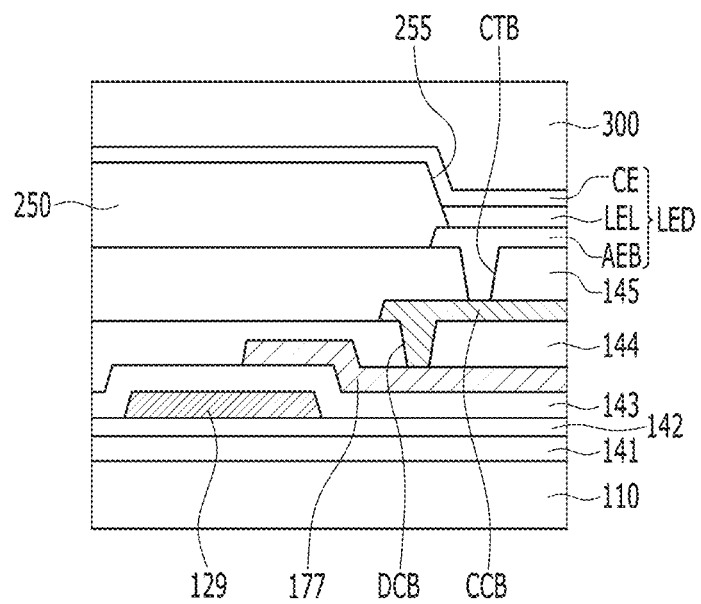
FIG. 11 is a cross-sectional view of a display panel according to an embodiment.

Also, in FIG. 1, the anodes AER, AEG, and AEB are shown from among the light-emitting element units. An outer portion of the anodes AER, AEG, and AEB overlap with a partition wall (e.g., refer to 250 of FIG. 11), and an opening (e.g., refer to 255 of FIG. 11 and FIG. 12) is disposed at a center portion of the partition wall. The organic emission layer is disposed in a corresponding opening of the partition wall. As shown in FIG. 11, the partition wall 250 and the organic emission layer are covered by the cathode CE.

The anodes AER, AEG, and AEB include a red pixel anode AER (or an anode AER of the red pixel), a green pixel anode AEG (or an anode AEG of the green pixel), and a blue pixel anode AEB (or an anode AEB of the blue pixel). The red pixel anode AER and the green pixel anode AEG are formed on the pixel circuit unit PXR of the red pixel. In other words, in a plan view, the pixel circuit unit PXR of the red pixel overlaps with the red pixel anode AER of the red pixel and the green pixel anode AEG of the green pixel.

On the other hand, the blue pixel anode AEB of the blue pixel is disposed on the pixel circuit unit PXG of the green pixel and the pixel circuit unit PXB of the blue pixel. As a result, an area of the light-emitting element unit or the red pixel anode AER of the red pixel and an area of the light-emitting element unit or the green pixel anode AEG of the green pixel are smaller than an area of the light-emitting element unit or the blue pixel anode AEB of the blue pixel. Also, in the embodiment of FIG. 1, the area of the light-emitting element unit or the anode AER of the red pixel may be larger (e.g., may be slightly larger) than the area of the light-emitting element unit or the anode AEG of the green pixel. However, the present disclosure is not limited thereto, and according to an embodiment, the area of the light-emitting element unit or the anode AEG of the green pixel may be the same or substantially the same as, or may be larger (e.g., slightly larger) than, the area of the light-emitting element unit or the anode AER of the red pixel.

The light emitting diode display device includes the red pixel, the green pixel, and the blue pixel, and the red pixel, the green pixel, and the blue pixel include the pixel circuit units PXR, PXG, and PXB, respectively. The anode includes the anode AER of the red pixel connected to the pixel circuit unit PXR of the red pixel, the anode AEG of the green pixel connected to the pixel circuit unit PXG of the green pixel, and the anode AEB of the blue pixel connected to the pixel circuit unit PXB of the blue pixel. The anode that does not overlap with the data line may have the largest area from among the anode AER of the red pixel, the anode AEG of the green pixel, and the anode AEB of the blue pixel. In addition, the data line that does not overlap with the anode having the largest area may be a data line that is connected to the pixel circuit unit to which the anode having the largest area is connected.

According to the embodiment of FIG. 1, the anode AEB of the blue pixel is shown as having the largest area, and thus, does not overlap with the data line 171B, which is connected to the pixel circuit unit PXB of the blue pixel.

The anode AEB of the blue pixel is divided into two portions, an anode AEB1 of a first blue pixel and an anode AEB2 of a second blue pixel, and does not overlap with the data line 171B on a plane (e.g., in a plan view). In other words, the anode AEB1 of the first blue pixel and the anode AEB2 of the second blue pixel are spaced apart (e.g., are separated) from each other, and in a plan view, the data line 171B is disposed between the anode AEB1 of the first blue pixel and the anode AEB2 of the second blue pixel. The data line 171B transverses and extends between the anode AEB1 of the first blue pixel and the anode AEB2 of the second blue pixel in a vertical direction (hereinafter, referred to as a second direction). Depending on an embodiment, a connection (e.g., a connection line or a connection electrode) may be further formed for receiving a current from the pixel circuit unit PXB of the blue pixel, and may provide the current to the anode AEB1 of the first blue pixel and the anode AEB2 of the second blue pixel. In this case, the connection may overlap with the data line 171B according to an embodiment.

Figure 4:
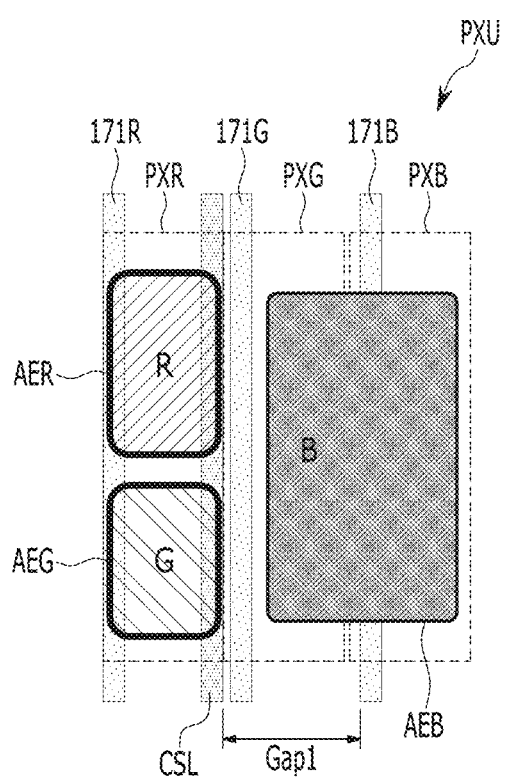
FIGS. 4-5 are schematic diagrams showing an arrangement of an element in a pixel according to one or more embodiments.

According to an embodiment, a portion between the two portions AEB1 and AEB2 of the anode AEB of the blue pixel may be understood as an opening, and when compared with the anode AEB of the blue pixel shown in the embodiment of FIG. 4, the portion between the two portions AEB1 and AEB2 shown in FIG. 1 where the anode AEB of the blue pixel is not formed may be referred to as an opening. The opening of the anode AEB of the blue pixel may be parallel to or substantially parallel to the data line 171B, and may not overlap with the data line 171B in a plan view.

According to an embodiment, a part of the anode AEB1 of the first blue pixel and a part of the data line 171B may overlap with each other, and a part of the anode AEB2 of the second blue pixel and a part of the data line 171B may also overlap with each other.

In FIG. 1, a characteristic to eliminate or reduce an area where the anode AEB1 of the first blue pixel and the anode AEB2 of the second blue pixel overlap with the data line 171B is shown. This characteristic may be to reduce a parasitic capacitance that may occur with the data line 171B.

In other words, in a high resolution display panel, the number of pixels increases, so it may be desired to write the data voltages to more pixels within a suitable or desired period of time (e.g., within a predetermined period of time). For example, a period 1H in which one scan line applies a turn-on voltage is shortened, and in order to accordingly apply the data voltage, high-speed driving in which a speed of changing the data voltage increases may be performed. In this case, an RC delay may occur in the data line, and the resistance from among the RC delay is determined according to a length of the data line and is generally a fixed value (e.g., almost a fixed value) when the size of the display device is determined, and thus, adjustment of the resistance may be difficult. Therefore, the RC delay may be affected by the parasitic capacitance occurring in the data line. If the RC delay occurring in the data line is large, the high-speed driving may become difficult, and therefore, the parasitic capacitance generated in the data line may be reduced to enable the high-speed driving. The parasitic capacitance occurring in all data lines may be reduced, but in some embodiments, the parasitic capacitance may be reduced for only the wiring with a large RC delay due to a large parasitic capacitance from among the data lines, so that the entire display device may be driven with high speed.

As shown in FIG. 1, due to a characteristic of blue light, the size of the blue light emitting diode (LED) (or the anode) from among the unit pixels PXU may be larger than the size of the light emitting diode (LED) (or the anode) of another color (e.g., red and/or green). In such a pixel structure, the parasitic capacitance occurring in the data line may be greatest in the anode AEB of the blue pixel where the area overlapping with the data line is the largest. Therefore, in order to reduce or remove the parasitic capacitance occurring in the data line, the overlapping area in the anode AEB of the blue pixel overlapping with the largest area may be reduced.

However, the present disclosure is not limited thereto, and according to an embodiment, the anode AER of the red pixel and/or the anode AEG of the green pixel may also be modified in the same or substantially the same way as the blue pixel anode AEB, for example, when the parasitic capacitance is large due to the anode AER of the red pixel and/or the anode of the green pixel being adjacent to or overlapping with the data lines 171R, 171G, and 171B.

Hereinafter, a modified structure of the unit pixel PXU is described with reference to FIG. 2 and FIG. 3.

Figure 2:
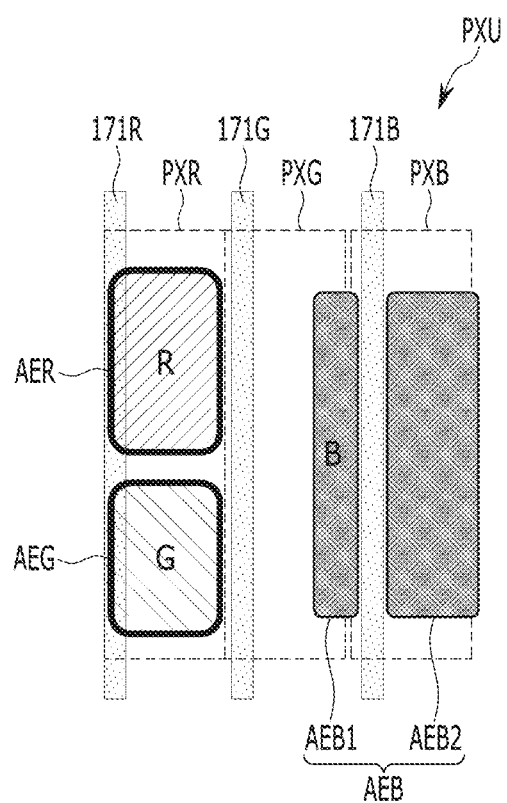
FIGS. 2-3 are schematic diagrams showing an arrangement of an element in a pixel according to one or more embodiments.
Figure 3:
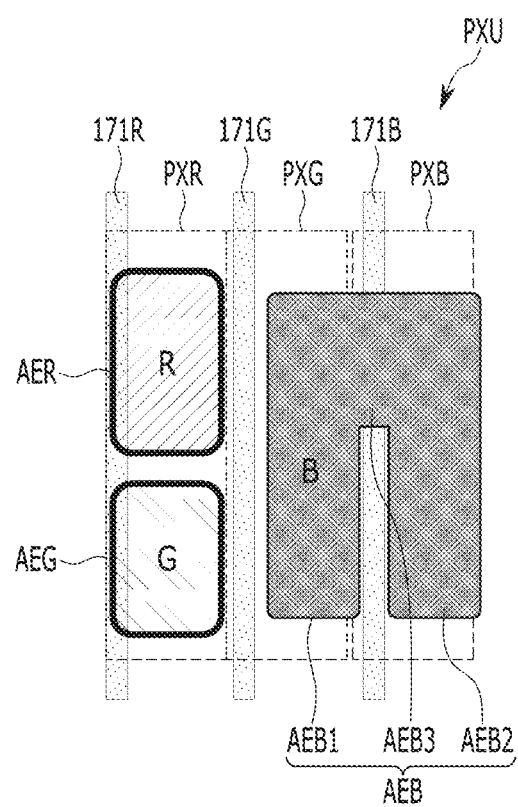

FIG. 2 and FIG. 3 are schematic diagrams showing an arrangement of an element in a pixel according to one or more embodiments.

First referring to FIG. 2, unlike that in FIG. 1, an embodiment in which the anode AEB1 of the first blue pixel and the anode AEB2 of the second blue pixel have different areas from each other is shown.

The anode AEB of the blue pixel is divided into the two portions AEB1 and AEB2, and does not overlap with the data line 171B in a plan view. In other words, the anode AEB1 of the first blue pixel and the anode AEB2 of the second blue pixel are spaced apart (e.g., are separated) from each other, and the data line 171B is positioned between the anode AEB1 of the first blue pixel and the anode AEB2 of the second blue pixel in a plan view. In the embodiment shown in FIG. 2, the anode AEB1 of the first blue pixel has a smaller area than that of the anode AEB2 of the second blue pixel, and is formed with a narrower width. However, according to an embodiment, the length of the anode AEB1 of the first blue pixel may be shorter than that of the anode AEB2 of the second blue pixel. According to an embodiment, the anode AEB1 of the first blue pixel positioned to the left of the data line 171B may have a larger area than that of the anode AEB2 of the second blue pixel positioned to the right of the data line 171B.

According to an embodiment, a connection (e.g., a connection line or a connection electrode) for receiving the current from the anode AEB1 of the first blue pixel and the anode AEB2 of the second blue pixel from the pixel circuit unit PXB of the blue pixel may be formed, and the connection may overlap with the data line 171B according to an embodiment. According to an embodiment, a part of the anode AEB1 of the first blue pixel may overlap with a part of the data line 171B, and a part of the anode AEB2 of the second blue pixel may overlap with a part of the data line 171B.

As shown in FIG. 2, like that in FIG. 1, an area where the anode AEB1 of the first blue pixel and the anode AEB2 of the second blue pixel overlap with the data line 171B may be eliminated or reduced to reduce the parasitic capacitance generated in the data line 171B, thereby enabling the high-speed driving.

However, according to an embodiment, the anode AER of the red pixel and/or the anode AEG of the green pixel may also be modified in the same or substantially the same way as that of the anode AEB of the blue pixel, for example, when the parasitic capacitance is large due to the anode AER of the red pixel and/or the anode AEG of the green pixel being adjacent to or overlapping with the data lines 171R, 171G, and 171B.

Referring to FIG. 3, unlike those in FIG. 1 and FIG. 2, the anode AEB of the blue pixel may not be divided into two portions that are spaced apart from each other, and may be formed as one portion (e.g., a unitary body). In other words, the two portions AEB1 and AEB2 of the anode AEB of the blue pixel may be connected to each other by an anode connection AEB3. The anode connection AEB3 may overlap with the data line 171B, but may not overlap with a portion of the data line 171B that is between the two portions AEB1 and AEB2 of the anode AEB of the blue pixel where the anode connection AEB3 is not positioned, so that the parasitic capacitance between the data line 171B and the anode AEB of the blue pixel may be reduced.

The anode AEB of the blue pixel may have a structure that partially overlaps with the data line 171B, and partially does not overlap with the data line 171B. The anode AEB of the blue pixel partially does not overlap with the data line 171B because of an opening that is positioned between the two portions AEB1 and AEB2 of the anode AEB of the blue pixel where the anode connection AEB3 is not positioned, and the opening overlaps with the data line 171B. In the embodiment of FIG. 3, the opening included in the anode AEB of the blue pixel is disposed under (e.g., underneath) the anode AEB of the blue pixel, and is connected to the outside. However, the present disclosure is not limited thereto, and according to an embodiment, the opening may be positioned on the upper side, or two anode connections AEB3 may be formed, and the opening may be positioned between the two anode connections AEB3 to be separated from the outside.

Even according to the structure of FIG. 3, because the parasitic capacitance between the data line 171B and the anode AEB of the blue pixel may be reduced, such structure may still be suitable for high-speed driving. Depending on a degree to which the parasitic capacitance is to be reduced, the size of the anode connection AEB3 (and/or the size of the opening) may be variously modified (e.g., may be variously adjusted).

Figure 5:
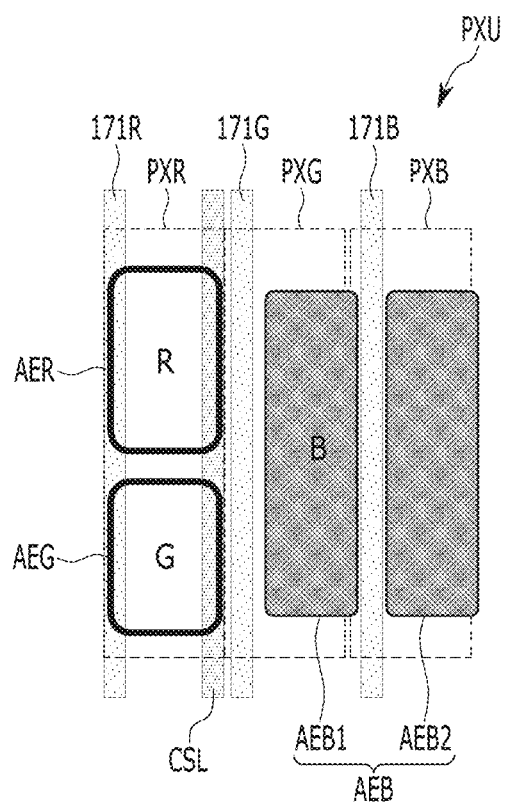

FIG. 4 and FIG. 5 illustrate embodiments in which a common voltage line CSL extending in the same or substantially the same direction as that of the data line 171B is disposed, and does not overlap with the anode AEB of the blue pixel, to reduce the parasitic capacitance of the data line 171B.

FIG. 4 and FIG. 5 are schematic diagrams showing an arrangement of an element in a pixel according to one or more embodiments.

In FIG. 4, the common voltage line CSL is formed at a position that does not overlap with the anode AEB of the blue pixel.

The display device according to the embodiment of FIG. 4 may include: the pixel circuit units PXR, PXG, and PXB; the data lines 171R, 171G, and 171B connected to the pixel circuit units PXR, PXG, and PXB for transmitting the data voltage; the common voltage line CSL connected to the pixel circuit units PXR, PXG, and PXB, and extending in the same or substantially the same direction as that of the data lines 171R, 171G, and 171B; the anode disposed on the data lines 171R, 171G, and 171B and the common voltage line CSL; the emission layer disposed on the anode; and the cathode disposed on the emission layer. Here, the anode, the emission layer, and the cathode constitute the light-emitting element unit.

The common voltage line CSL is a line other than the data lines 171R, 171G, and 171B from among the plurality of signal lines that are connected to each pixel circuit unit PXR, PXG, and PXB, and is a wiring that is formed to be parallel to or substantially parallel to the data lines 171R, 171G, and 171B. Further, according to an embodiment, the common voltage line CSL may be a wiring in which a voltage is applied to all three pixel circuit units PXR, PXG, and PXB through one wire. According to an embodiment, the common voltage line CSL, which may be a voltage line for applying a voltage to the pixel circuit unit, may include one from among a bias voltage line, a reference voltage line, a driving voltage line, a driving low voltage line, and an initialization voltage line. According to an embodiment, the voltage applied to the common voltage line CSL may have a constant or substantially constant voltage level during one frame, or may have varying voltage levels.

As shown in FIG. 4, by not overlapping the common voltage line CSL with the anode AEB of the blue pixel, the parasitic capacitance generated in the data line 171B may be indirectly reduced to enable the high-speed driving. In other words, based on the data line 171B, the data line 171B forms the parasitic capacitance with the anode AEB of the blue pixel, and the parasitic capacitance generated in the data line 171B increases as the parasitic capacitance of the anode AEB of the blue pixel with other parts is larger. Therefore, the parasitic capacitance occurring in the data line 171B may be indirectly reduced by reducing the capacitance of the anode AEB of the blue pixel. FIG. 4 is an embodiment in which the parasitic capacitance generated between the common voltage line CSL and the blue pixel anode AEB is reduced by not overlapping the common voltage line CSL with the anode AEB of the blue pixel, thereby reducing the parasitic capacitance generated in the data line 171B.

The embodiment of FIG. 4 is an embodiment in which the parasitic capacitance generated by the anode AEB of the blue pixel having the largest area is the largest, and thus, the parasitic capacitance generated by the anode AEB of the blue pixel is reduced. It may be difficult to change the position of the anode AEB of the blue pixel because constituent elements for each part are formed in each of the pixel circuit units PXR, PXG, and PXB for each colored pixel, but the common voltage line CSL may be positioned every several pixel circuit units in the case that the common voltage line CSL is used commonly in each of the adjacent pixel circuit units PXR, PXG, and PXB, so there may be less difficulty in changing the position of the common voltage line CSL. Therefore, FIG. 4 illustrates an embodiment in which the position of the common voltage line CSL is determined such that it does not overlap with the anode AEB of the blue pixel.

In the embodiment of FIG. 4, unlike those of FIG. 1 to FIG. 3, the anode AEB of the blue pixel does not include a separate opening. In other words, the parasitic capacitance may be sufficiently reduced by an arrangement of (e.g., by moving or rearranging only) the common voltage line CSL, and thus, there may be no problems with high-speed driving.

However, according to some embodiments, for example, one of these embodiments being shown in FIG. 5, in addition to the embodiment of FIG. 4, in a case in which it may be desired to additionally reduce the parasitic capacitance, similar to those shown in FIG. 1 to FIG. 3, an opening may be formed in the anode AEB of the blue pixel, so that the anode AEB of the blue pixel and the data line 171B do not overlap with each other at least at (e.g., in or on) some regions thereof.

FIG. 5 shows an embodiment in which the embodiment of FIG. 4 and the embodiment of FIG. 1 are combined with each other.

In other words, similar to the embodiment of FIG. 1, the anode AEB of the blue pixel is divided into the two portions AEB1 and AEB2, and does not overlap with the data line 171B in a plan view. Also, similar to the embodiment of FIG. 4, the common voltage line CSL may be disposed at a position that does not overlap with the anode AEB of the blue pixel.

As a result, the parasitic capacitance generated in the data line 171B may be reduced (e.g., may be greatly reduced), and the signal delay may occur below a certain standard, thereby enabling the high-speed driving.

In the embodiments of FIG. 1 to FIG. 5, the anode AEB of the blue pixel is shown as being larger than the anodes AER and AEG of the other different colored pixels. However, because the anode of any suitable colored pixel may be formed to be larger according to the emission layer and the characteristics of the light emitted therefrom, the anode of the other different colored pixels may be formed to be larger according to some embodiments.

In the above description with reference to FIGS. 1 to 5, some embodiments of the present disclosure have been described while centering on some constituent elements (e.g., the unit pixel PXU).

Hereinafter, an actual pixel configuration is described in more detail, centering on one specific pixel with reference to FIG. 6 to FIG. 11.

First, the circuit structure of one pixel is described with reference to FIG. 6.

Figure 6:
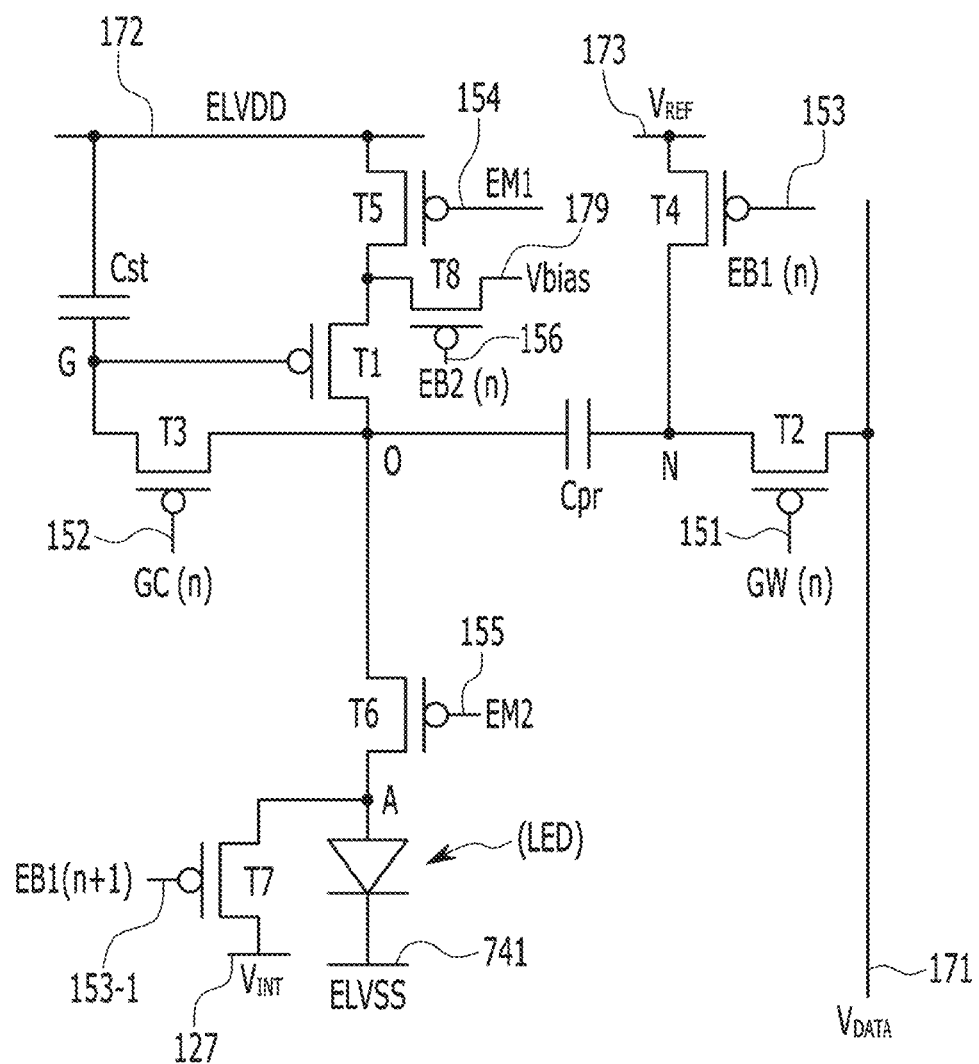
FIG. 6 is a circuit diagram of a pixel according to an embodiment.

FIG. 6 is a circuit diagram of a pixel according to an embodiment.

One pixel may be largely composed of the pixel circuit unit, and the light-emitting element unit. The pixel circuit unit may include: a driving transistor T1 that transmits an output current to the anode of the light-emitting element unit; an input capacitor Cpr; and a second transistor T2 connected to the data line 171 to transmit the data voltage to the input capacitor.

The pixel of the light emitting diode display device according to the embodiment of FIG. 6 includes a plurality of transistors T1, T2, T3, T4, T5, T6, T7, and T8, a plurality of capacitors Cst and Cpr, and a light emitting diode (LED). The pixel is connected to several signal lines 127, 151, 152, 153, 153-1, 154, 155, 156, 171, 172, 173, and 179. When one pixel is divided into the pixel circuit units PXR, PXG, and PXB and the light-emitting element unit, the light-emitting element is the light emitting diode (LED), and other transistors and capacitors configure the pixel circuit units PXR, PXG, and PXB. The light emitting diode (LED) may be an organic light emitting diode or an inorganic light emitting diode (LED).

The plurality of transistors T1, T2, T3, T4, T5, T6, T7, and T8 include the driving transistor T1 (which may also be referred to as a first transistor) for generating the output current to the light emitting diode (LED), the second transistor T2 for transmitting a data voltage $V_{DATA}$ applied to the data line 171 to the pixel, a third transistor T3 connecting an output electrode and a gate electrode of the driving transistor T1 to each other, a fourth transistor T4 for changing one terminal of the input capacitor Cpr to a reference voltage VREF, a fifth transistor T5 for transmitting a driving voltage ELVDD to the driving transistor T1, a sixth transistor T6 for transmitting the output current of the driving transistor T1 to the light emitting diode (LED), a seventh transistor T7 for changing the anode of the light emitting diode (LED) into an initialization voltage $V_{INT}$, and an eighth transistor T8 for transmitting a bias voltage Vbias to the driving transistor T1.

The plurality of signal lines 127, 151, 152, 153, 153-1, 154, 155, 156, 171, 172, 173, and 179 may include a first scan line 151, a second scan line 152, first and second initialization control lines 153 and 153-1, first and second light emission control lines 154 and 155, a bias control line 156, the data line 171, a driving voltage line 172, a reference voltage line 173, a bias voltage line 179, and an initialization voltage line 127. The second initialization control line 153-1 may be the same wire as that of the first initialization control line 153 that is connected to the pixels of a next row. Signals having different timings from one another may be applied to the first light emission control line 154 and the second light emission control line 155.

The reference voltage line 173 transmits a reference voltage VREF to a node N to which the input capacitor Cpr and the second transistor T2 are connected. The driving voltage line 172 transmits the driving voltage ELVDD to the driving transistor T1, and a driving low voltage line 741 transmits the driving low voltage ELVSS to the cathode. The initialization voltage line 127 transmits the initialization voltage $V_{INT}$ to the anode, and the bias voltage line 179 transmits the bias voltage Vbias to the driving transistor T1.

The plurality of capacitors Cst and Cpr include a storage capacitor Cst for constantly maintaining the voltage of the gate electrode of the driving transistor T1 during one frame, and an input capacitor Cpr for transmitting the data voltage $V_{DATA}$ transmitted through the second transistor T2 to one electrode of the driving transistor T1. According to an embodiment, the input capacitor Cpr may be omitted, and because the input capacitor Cpr is not included, the data voltage $V_{DATA}$ may be directly transmitted to one electrode of the driving transistor T1.

The connection relationships between the elements included in the pixel are described in more detail hereinafter.

The driving transistor T1 adjusts a magnitude of the current output according to the data voltage $V_{DATA}$ applied to the gate electrode, and the output current is applied to the anode of the light emitting diode (LED). Accordingly, a brightness of the light emitting diode (LED) is adjusted according to the data voltage $V_{DATA}$. The first electrode of the driving transistor T1 is connected to the driving voltage line 172 via the fifth transistor T5 to receive the driving voltage ELVDD. In addition, the first electrode of the driving transistor T1 receives a bias voltage Vbias through the eighth transistor T8, and the first electrode voltage of the driving transistor T1 is maintained or substantially maintained at a desired level (e.g., at a predetermined or certain level). Meanwhile, the second electrode of the driving transistor T1 (e.g., a node O) is disposed to output the current toward the light emitting diode (LED), and is connected to the anode of the light emitting diode (LED) via the sixth transistor T6. The second electrode of the driving transistor T1 is connected to the input capacitor Cpr to receive the data voltage $V_{DATA}$ input through the second transistor T2. The gate electrode of the driving transistor T1 (e.g., a node G) is connected to the storage capacitor Cst. Accordingly, the voltage of the gate electrode of the driving transistor T1 changes according to the voltage stored in the storage capacitor Cst, and accordingly, the current output by the driving transistor T1 changes. The gate electrode and the second electrode of the driving transistor T1 are connected to each other by the third transistor T3.

The second transistor T2 accepts the data voltage $V_{DATA}$ into the pixel (e.g., into the node N in FIG. 6). The gate electrode of second transistor T2 is connected to the first scan line 151, and the first electrode of the second transistor T2 is connected to the data line 171. The second electrode of the second transistor T2 is connected to the second electrode of the driving transistor T1 (e.g., to the node O) through the input capacitor Cpr. When the second transistor T2 is turned on according to the first scan signal GW(n) transmitted through the first scan line 151, the data voltage $V_{DATA}$ transmitted through the data line 171 is transmitted to the second electrode of the driving transistor T1 through the input capacitor Cpr.

The third transistor T3 is configured to allow the data voltage $V_{DATA}$ to be transferred to the gate electrode and to the storage capacitor Cst, and to compensate the threshold voltage of the driving transistor T1 to be stored in the storage capacitor Cst. The gate electrode of the third transistor T3 is connected to the second scan line 152, the first electrode of the third transistor T3 is connected to the node O and to be connected to the second electrode of the driving transistor T1 and to the input capacitor Cpr, and the first electrode of the third transistor T3 is connected to the node G to be connected to the gate electrode of the driving transistor T1 and to the storage capacitor Cst. In other words, when the driving transistor T1 is diode-connected by the third transistor T3, and the driving transistor T1 is turned on with the voltage applied to the storage capacitor Cst, a negative charge stored in the storage capacitor Cst is discharged, and the voltage of the storage capacitor Cst increases. Then, at the threshold voltage of the driving transistor T1, the driving transistor T1 is turned off, and the voltage no longer decreases, so that the voltage stored in the storage capacitor Cst becomes a value of the threshold voltage of the driving transistor T1. With this structure, even when each driving transistor T1 has a different threshold voltage, the driving transistor T1 may be compensated for and operated in each pixel circuit unit.

The fourth transistor T4 serves to initialize the voltage of the first electrode of the input capacitor Cpr (or the voltage of the second electrode of the second transistor T2) to the reference voltage VREF. The gate electrode of the fourth transistor T4 is connected to the first initialization control line 153, the first electrode of the fourth transistor T4 is connected to the reference voltage line 173, and the second electrode of the fourth transistor T4 is connected to the first electrode of the input capacitor Cpr and to the second electrode of the second transistor T2.

The fifth transistor T5 serves to transmit the driving voltage ELVDD to the driving transistor T1. The gate electrode of the fifth transistor T5 is connected to the first light emission control line 154, the first electrode of the fifth transistor T5 is connected to the driving voltage line 172, and the second electrode of the fifth transistor T5 is connected to the first electrode of the driving transistor T1.

The sixth transistor T6 serves to transmit the output current output from the driving transistor T1 to the light emitting diode (LED). The gate electrode of the sixth transistor T6 is connected to the second light emission control line 155, the first electrode of the sixth transistor T6 is connected to the second electrode of the driving transistor T1, and the second electrode of the sixth transistor T6 is connected to the anode of the light emitting diode (LED).

The seventh transistor T7 serves to initialize the anode of the light emitting diode (LED) to an initialization voltage $V_{INT}$. The gate electrode of the seventh transistor T7 is connected to the second initialization control line 153-1, the first electrode of the seventh transistor T7 is connected to the anode (e.g., the node A) of the light emitting diode (LED), and the second electrode of the seventh transistor T7 is connected to the initialization voltage line 127. The second initialization control line 153-1 may be the same wire as that of the first initialization control line 153 that is connected to the pixels in a next row.

The eighth transistor T8 serves to apply the bias voltage Vbias to the first electrode of the driving transistor T1, so that the voltage level of the first electrode of the driving transistor T1 does not exceed a suitable range (e.g., a predetermined or certain range). The gate electrode of the eighth transistor T8 is connected to the bias control line 156, the first electrode of the eighth transistor T8 is connected to the bias voltage line 179, and the second electrode of the eighth transistor T8 is connected to the first electrode of the driving transistor T1.

The first storage electrode of the storage capacitor Cst is connected to the driving voltage line 172, and the second storage electrode thereof is connected to the node G, or in other words, to the gate electrode of the driving transistor T1 and to the second electrode of the third transistor T3. As a result, the second storage electrode has the same or substantially the same voltage as that of the gate electrode of the driving transistor T1, and the voltage of the gate electrode of the driving transistor T1 is maintained or substantially maintained to be constant or substantially constant for one frame.

The first electrode of the input capacitor Cpr is connected to the node N, or in other words, to the second electrode of the second transistor T2 and to the second electrode of the fourth transistor T4, and the second electrode of the input capacitor Cpr is connected to the second electrode (e.g., the node O) of the driving transistor T1.

On the other hand, the anode (e.g., the node A) of the light emitting diode (LED) is connected to the second electrode of the sixth transistor T6 and to the first electrode of the seventh transistor T7, and the cathode receives the driving low voltage ELVSS.

Figure 7:
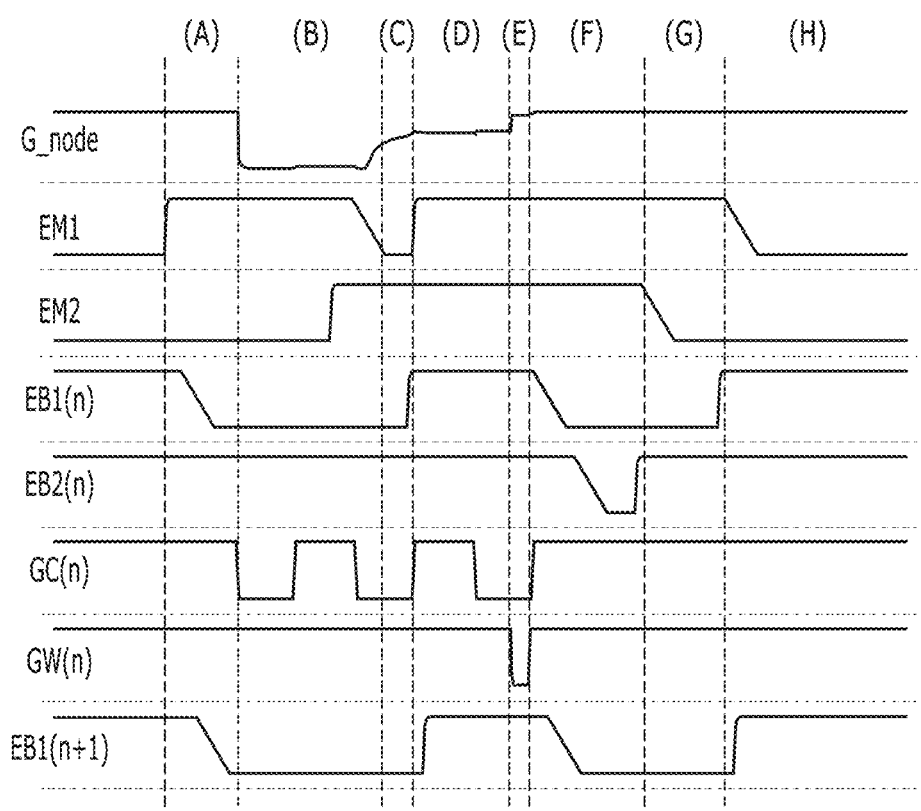
FIG. 7 is a waveform diagram applied to the pixel of FIG. 6.

Signals according to the same or substantially the same waveform as that shown in FIG. 7 may be applied to the pixel with the circuit structure shown in FIG. 6.

FIG. 7 is a waveform diagram applied to the pixel of FIG. 6.

For explanation, the periods A, B, C, D, E, F, G, and H are divided in FIG. 6, and the period H is disposed before the period A.

First, the period H (hereinafter referred to as a light emission period) is described in more detail.

In the period H, the first light emission control signal EM1 and the second light emission control signal EM2 that are applied to the fifth transistor T5 and the sixth transistor T6 are applied with a low level turn-on voltage, and the other signals are applied with a high level turn-off voltage. As a result, the fifth transistor T5 and the sixth transistor T6 are turned on, and the driving transistor T1 that is applied with the driving voltage ELVDD has a structure that is connected to the light emitting diode (LED). As a result, the output current is generated according to the driving voltage ELVDD and the voltage of the gate electrode of the driving transistor T1 (e.g., the voltage of the node G), and the output current is transmitted to the light emitting diode (LED). In light emitting diodes (LED), luminance is displayed according to the magnitude of the transmitted output current.

Next, the first light emission control signal EM1 is changed to a high level voltage, and the period A is entered (e.g., the period A begins). At this time, the first initialization control signal EB1(n) and the second initialization control signal EB1(n+1) are sequentially changed to the low level voltage. A time difference at which the first initialization control signal EB1(n) and the second initialization control signal EB1(n+1) are changed to the low level voltage may be 1H. In the period A, the driving transistor T1 does not generate the output current while the driving voltage ELVDD is not applied to the driving transistor T1. Also, the voltage of the node N (e.g., the second electrode of the second transistor T2 and the second electrode of the fourth transistor T4) is initialized into the reference voltage VREF by the fourth transistor T4, and the node A (e.g., the anode of the light emitting diode (LED)) is initialized into the initialization voltage $V_{INT}$ through the seventh transistor T7. In the period A, because the sixth transistor T6 is turned on, the initialization voltage $V_{INT}$ is transferred to the node O through the node A, and the node O is also initialized. Because the second electrode of the driving transistor T1, the first electrode of the third transistor T3, and the second electrode of the input capacitor Cpr are connected to the node O, they are all initialized into the initialization voltage $V_{INT}$.

Next, when entering the period B, the second scan signal GC(n) is first changed to the low level voltage, and the initialization voltage $V_{INT}$ applied to the node O is transmitted to the node G, so that the node G is also initialized into the initialization voltage $V_{INT}$. The gate electrode of the driving transistor T1 that is connected to the node G and the second electrode of the storage capacitor Cst are also initialized with the initialization voltage $V_{INT}$.

Next, the second scan signal GC(n) repeats the high level voltage and the low level voltage a plurality of times (e.g., several times), and applies the low level voltage in a data writing period (e.g., the period E). The second scan signal GC(n) maintains or substantially maintains the high level voltage after the data writing period (e.g., after the period E). According to an embodiment, the number of times that the second scan signal GC(n) is changed to the low level voltage may be variously modified, so long as the second scan signal GC(n) is changed to the low level voltage at least one time before a next light emission period H.

After the second light emission control signal EM2 is changed to the high level voltage, the period C is entered while the first light emission control signal EM1 is changed from the high level to the low level voltage.

The period C is referred to as a threshold voltage compensation period, and the first light emission control signal EM1 and the second scan signal GC(n) have the low level voltage in the period C, so that the diode connection structure of the driving transistor T1 is formed by the third transistor T3 while the driving voltage ELVDD is applied to the driving transistor T1.

At this time, because the voltage of the node G is the initialization voltage $V_{INT}$, the driving transistor T1 is turned on while the negative charge stored in the storage capacitor Cst is discharged, and as the voltage of the storage capacitor Cst increases, the driving transistor T1 is turned off at the threshold voltage of the driving transistor T1. As a result, in the storage capacitor Cst, a voltage value ($V_{ELVDD}$-Vth) that is lower than the threshold voltage Vth of the driving transistor T1 is stored at the node G based on the driving voltage ELVDD.

On the other hand, in the period C, the node N and the node A are continuously maintained with the reference voltage VREF and the initialization voltage $V_{INT}$ by the first initialization control signal EB1(n) and the second initialization control signal EB1(n+1)

Next, while the first light emission control signal EM1, the first initialization control signal EB1(n), and the second initialization control signal EB1(n+1) are changed to the high level voltage, the period D is entered. At this time, the second scan signal GC(n) may also be changed to the high level voltage. In the period D, the operation of compensating for the threshold voltage is terminated, and the period D is a period for preparing a subsequent period E (also referred to as the data writing period).

Next, while the first scan signal GW(n) is changed into the low level voltage during the period in which the second scan signal GC(n) is changed into the low level voltage, the period E is entered.

In the period E, the second transistor T2 is turned on, and the data voltage $V_{DATA}$ passes through the input capacitor Cpr to be transferred to the node O. At this time, because the third transistor T3 is also turned on by the second scan signal GC(n), the data voltage $V_{DATA}$ is applied to the node G. When being transmitted to the node O and the node G, the data voltage transmitted to the node N is decreased by a partial ratio (α) according to the capacitance magnitude of the input capacitor Cpr. When the data voltage that is transmitted while the partial ratio (α) is decreased as described above is $αV_{DATA}$, and the existing voltage value of the node G is ($V_{ELVDD}$-Vth), the final voltage of the node G during the period E may have a value of ($V_{ELVDD}$-Vth+$αV_{DATA}$).

As a result, the data voltage is also included in the storage capacitor Cst while the threshold voltage of the driving transistor T1 is compensated for.

After that, the first scan signal GW(n) is changed to the high level voltage, and the period F is entered. At this time, the second scan signal GC(n) is also changed to the voltage of the high level, and the second scan signal GC(n) maintains or substantially maintains the high level from the period F to a period B of a next frame.

In the period F, the first initialization control signal EB1(n) and the second initialization control signal EB1(n+1) are changed into the low level voltage, and the node N and the node A are again initialized. In addition, the bias control signal EB2(n) is also changed to the low level voltage to apply the bias voltage Vbias to the driving transistor T1. The bias voltage Vbias is set to a constant or substantially constant voltage according to the characteristics of the panel, and may have various suitable voltage values for each panel. The bias voltage Vbias may be set to have one suitable voltage value (e.g., one predetermined voltage value) on one panel, so that the voltage of the first electrode of the driving transistor T1 does not change due to a change in a surrounding voltage.

Next, while the bias control signal EB2(n) is changed into the high level voltage, the period G is entered. In the period G, the second light emission control signal EM2 is applied with a low level voltage to prepare to enter the light emission period H, and the first initialization control signal EB1(n) and the second initialization control signal EB1(n+1) are maintained or substantially maintained with the low level voltage.

Next, while the first initialization control signal EB1(n) and the second initialization control signal EB1(n+1) are changed into the high level voltage, and the first light emission control signal EM1 is changed into the low level voltage, the light emission period (e.g., the period H) is entered.

In the period H, the driving transistor T1 receives the driving voltage ELVDD to generate the output current according to the voltage of the node G, and transmits the output current to the light emitting diode (LED) to emit light with a desired luminance (e.g., with a predetermined luminance).

An embodiment that implements the pixel operated by the circuit structure and the applied signals as described above may be the same or substantially the same as that shown in FIG. 8 to FIG. 11.

First, the structure of the pixel circuit units PXR, PXG, and PXB is described in more detail with reference to FIG. 8 to FIG. 10.

Figure 8:
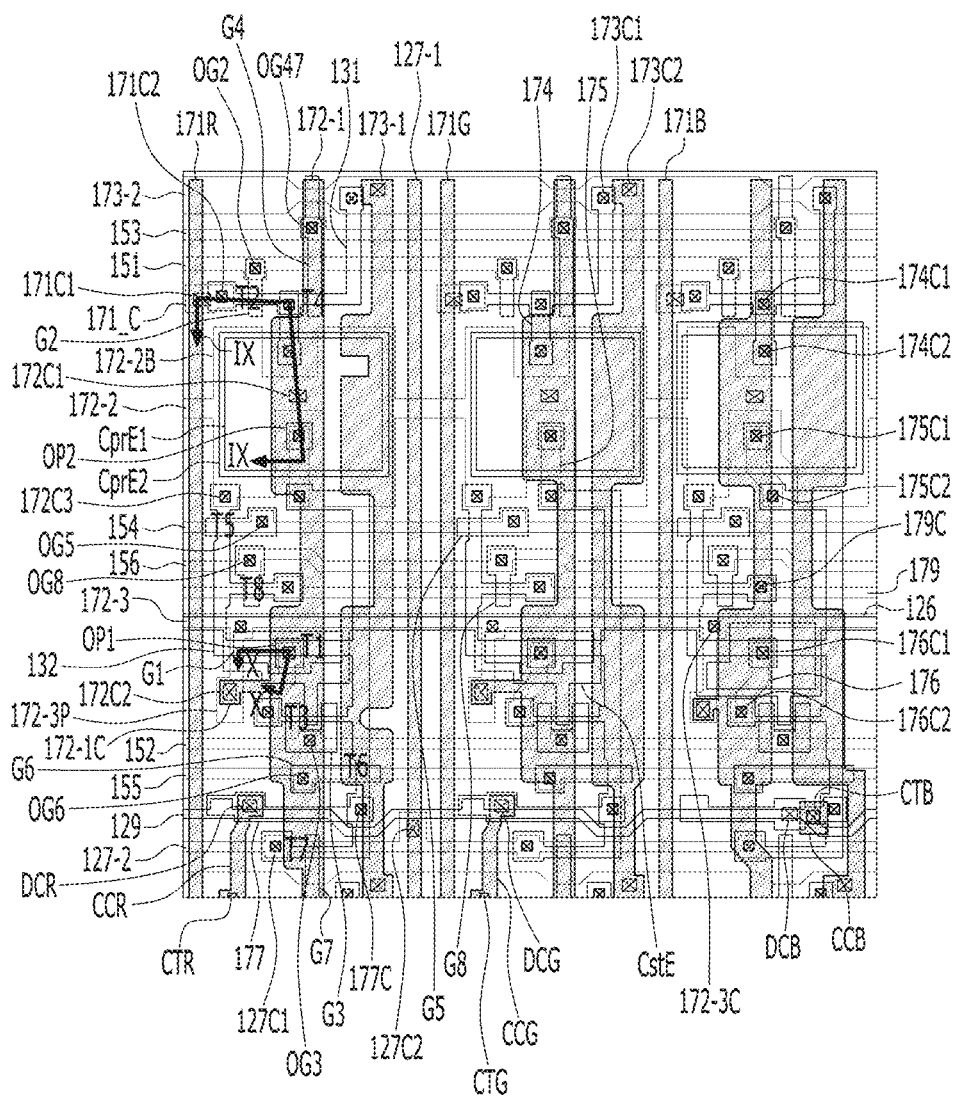
FIG. 8 is a layout view of a pixel according to an embodiment.
Figure 9:
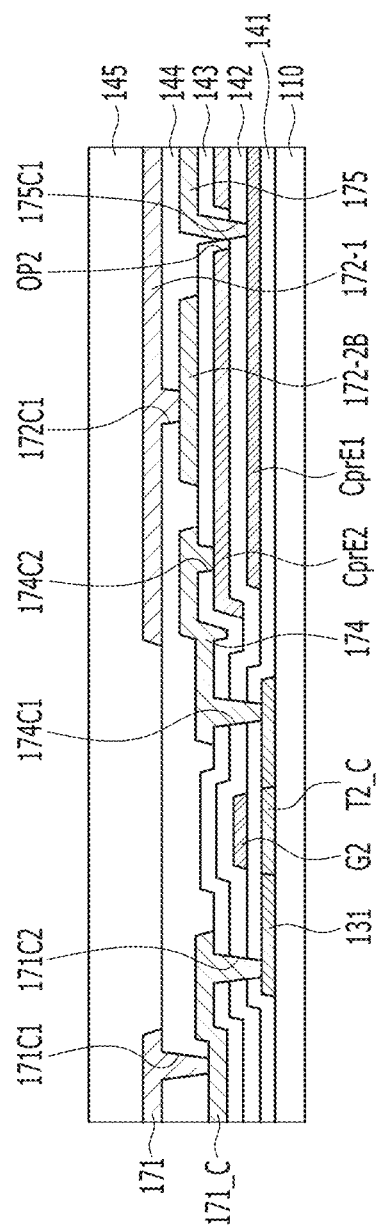
FIG. 9 is a cross-sectional view taken along the line IX-IX of FIG. 8.
Figure 10:
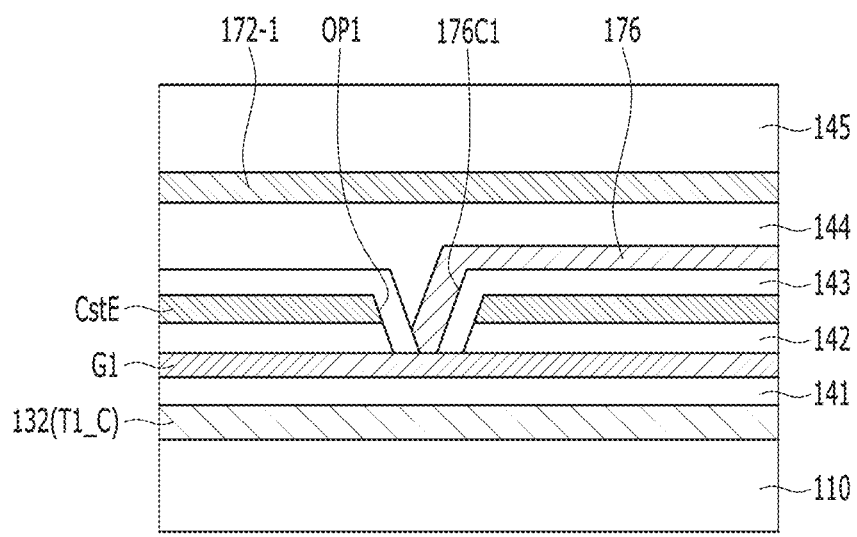
FIG. 10 is a cross-sectional view taken along the line X-X of FIG. 8.

FIG. 8 is a layout view of a pixel according to an embodiment, FIG. 9 is a cross-sectional view taken along the line IX-IX of FIG. 8, and FIG. 10 is a cross-sectional view taken along the line X-X of FIG. 8.

First, in FIG. 8, based on the embodiment of FIG. 4, a first initialization voltage line 127-1 extending in the vertical direction is shown as an example of the common voltage line CSL. As shown in FIG. 8, the first initialization voltage line 127-1 is parallel to or substantially parallel to the data lines 171R, 171G, and 171B, extends in the vertical direction, and is disposed between the red pixel circuit unit PXR and the green pixel circuit unit PXG to be farther away from the blue pixel circuit unit PXB. As a result, as shown in FIG. 4, even if the blue pixel anode AEB is formed, the blue pixel anode AEB and the first initialization voltage line 127-1 are configured to not overlap with each other in a plan view.

In FIG. 8, each of the pixel circuit units PXR, PXG, and PXB is classified based on the data lines 171R, 171G, and 171B, and a region from a corresponding one of the data line to the first reference voltage line 173-1 may correspond to one pixel circuit unit from among the pixel circuit units PXR, PXG, and PXB. In addition, only one first reference voltage line 173-1 is formed corresponding to three or more pixels, and may be shared with a plurality of adjacent pixels. In the present embodiment, the common voltage flowing through the common voltage line CSL may be the reference voltage VREF.

A specific pixel structure is described in more detail hereinafter.

The light emitting diode display device according to an embodiment includes a first scan line 151, a second scan line 152, a first initialization control line 153, first and second light emission control lines 154 and 155, and a bias control line 156, each extending mainly in the first direction (hereinafter, referred to as a horizontal direction). Also, a voltage line extending in the first direction is formed, and second and third driving voltage lines 172-2 and 172-3, a second reference voltage line 173-2, and the second initialization voltage line 127-2 are included. The second initialization control line 153-1 is the first initialization control line 153 that is connected to the pixels in the next row. In the embodiment of FIG. 8, a repair line 129 extending in the first direction is also formed. The repair line 129 includes a pattern extending in the first direction in the first gate conductive layer, in the second gate conductive layer, and in the first data conductive layer, so that the repair line 129 may be used for repairing if necessary or desired. The repair line 129 may be repaired to share the current transmitted to the anode of adjacent pixels.

The light emitting diode display device further includes the data lines 171R, 171G, and 171B for transmitting the data voltage $V_{DATA}$, and the first driving voltage line 172-1 for transmitting the driving voltage ELVDD, each extending in the second direction (e.g., the vertical direction) crossing the first direction. The light emitting diode display device further includes the first reference voltage line 173-1 and the first initialization voltage line 127-1 for transmitting the reference voltage VREF and the initialization voltage $V_{INT}$, respectively.

Each channel of the driving transistor T1, the second transistor T2, the third transistor T3, the fourth transistor T4, the fifth transistor T5, the sixth transistor T6, the seventh transistor T7, and the eighth transistor T8 is disposed in two semiconductor layers 131 and 132 that extend while being curved. The second semiconductor layer 132 includes the channels of the driving transistor T1, the third transistor T3, the fifth transistor T5, the sixth transistor T6, the seventh transistor T7, and the eighth transistor T8. The first semiconductor layer 131 includes the channels of the second transistor T2 and the fourth transistor T4. The channel of each transistor is formed only at a position from among the semiconductor layers 131 and 132 overlapping with the gate electrode of each transistor, and at (e.g., in or on) the left and right sides of the channel, the first region and the second region having the conductive characteristic corresponding to the first and second electrodes of the corresponding transistor are disposed. In other words, the semiconductor layers 131 and 132 include polycrystalline semiconductors, for example, such as polysilicon, and are conductive through a plasma treatment or doping, except for the channel of each transistor. The conductive first and second regions positioned at (e.g., in or on) respective sides of the channels may serve as the first and second electrodes of the plurality of transistors T1, T2, T3, T4, T5, T6, T7, and T8, respectively. In addition, some regions of the semiconductor layers 131 and 132 are conductive, so that different transistors may be directly and electrically connected to each other.

Each channel of the plurality of transistors T1, T2, T3, T4, T5, T6, T7, and T8 overlaps with a corresponding gate electrode of the transistors T1, T2, T3, T4, T5, T6, T7, and T8, and is disposed between corresponding first and second regions of the transistor T1, T2, T3, T4, T5, T6, T7, and T8. The plurality of transistors T1, T2, T3, T4, T5, T6, T7, and T8 may have the same or substantially the same stacked structure as each other. In the following, the driving transistor T1 is mainly described in more detail, and the other remaining transistors T2, T3, T4, T5, T6, T7, and T8 may be briefly described, or redundant description thereof may not be repeated.

Referring to FIG. 8 and FIG. 10, the driving transistor T1 includes the gate electrode G1, the channel formed at a position of the second semiconductor layer 132 overlapping with the gate electrode G1, and the first region and the second region disposed at (e.g., in or on) respective sides (e.g., opposite sides) of the channel. In other words, the channel of the driving transistor T1 is disposed between the first region and the second region, and overlaps with the gate electrode G1 in a plan view. In FIG. 8, the channel of the driving transistor T1 has a linear shape extending in the first direction. However, according to an embodiment, the channel of the driving transistor T1 may have a curved structure, and as an example, may be formed in an omega ($\Omega$) shape.

The second semiconductor layer 132 and the first semiconductor layer 131 including the channel, the first region, and the second region are disposed on the substrate 110, and the semiconductor layers 131 and 132 are covered by the first gate insulating layer 141. The substrate 110 may be a glass substrate, and according to an embodiment, may be a flexible substrate including plastic or polyimide (PI). In the case of a flexible substrate, an inorganic insulating layer, for example, such as a buffer layer or a barrier layer, may be further included between the substrate 110 and the semiconductor layers 131 and 132. The first gate insulating layer 141 may include an inorganic insulating material, for example, such as a silicon nitride (SiNx), a silicon oxide (SiOx), and/or a silicon oxynitride (SiOxNy).

On the first gate insulating layer 141, the first gate conductive layer including the gate electrode G1 is disposed. The first gate conductive layer may include molybdenum (Mo), aluminum (Al), copper (Cu), and/or titanium (Ti), and may have a single layer structure or a multi-layered structure of one or more of the above-described materials.

Each gate electrode G2, G3, G4, G5, G6, G7, and G8 of the other transistors T2, T3, T4, T5, T6, T7, and T8 is also formed in the first gate conductive layer. As a result, all of the transistors T1, T2, T3, T4, T5, T6, T7, and T8 are formed through the semiconductor layers 131 and 132 and the first gate conductive layer. In addition, the gate electrodes G2, G3, G4, G5, G6, G7, and G8 of the other transistors T2, T3, T4, T5, T6, T7, and T8, other than the gate electrode G1 of the driving transistor T1, all receive the control signals, and have a structure in which they are electrically connected to the corresponding signal lines positioned on a first data conductive layer, which will be described in more detail below.

In addition, the first gate conductive layer also includes the first electrode CprE1 of the input capacitor Cpr.

A second gate insulating layer 142 is formed on the first gate conductive layer. The second gate insulating layer 142 may include an inorganic insulating material, for example, such as a silicon nitride (SiNx), a silicon oxide (SiOx), and/or a silicon oxynitride (SiOxNy).

The second gate conductive layer is positioned on the second gate insulating layer 142. The second gate conductive layer includes one electrode of the storage capacitor Cst, and one electrode of the input capacitor Cpr. The second gate conductive layer may include molybdenum (Mo), aluminum (Al), copper (Cu), and/or titanium (Ti), and may have a single-layer structure or a multi-layered structure of one or more of the above-described materials.

As shown in FIG. 8 and FIG. 10, an extended portion CstE of a storage line 126 is insulated and disposed on the gate electrode G1. The storage line 126 extends in the first direction, overlaps with the third driving voltage line 172-3 in a plan view, and is electrically connected to the third driving voltage line 172-3 through an opening 172-3C.

The extended portion CstE of the storage line 126 forms the storage capacitor Cst by overlapping with the gate electrode G1 via the second gate insulating layer 142 therebetween in a plan view. The extended portion CstE of the storage line 126 is the first storage electrode of the storage capacitor Cst, and the gate electrode G1 is the second storage electrode of the storage capacitor Cst. By using the gate electrode G1 as the second storage electrode, it may be possible to secure a sufficient space to form the storage capacitor Cst in a space narrowed by the channel of the driving transistor T1, which occupies a large area within the pixel. The extended portion CstE of the storage line 126 has an opening OP1 so as to connect the gate electrode G1 to the first connecting member 176.

Referring to FIG. 8 and FIG. 9, the structure of the input capacitor Cpr may be confirmed.

The input capacitor Cpr includes the first electrode CprE1 positioned on the first gate conductive layer, and the second electrode CprE2 positioned on the second gate conductive layer while overlapping with the first electrode CprE1 in a plan view. The second gate insulating layer 142 may be positioned between the first electrode CprE1 and the second electrode CprE2, and may be used as a dielectric layer.

The second electrode CprE2 of the input capacitor Cpr has an opening OP2, so that the first electrode CprE1 may be connected to the second connecting member 175.

A first interlayer insulating layer 143 is formed on the second gate conductive layer. The first interlayer insulating layer 143 may include an inorganic insulating material, for example, such as a silicon nitride (SiNx), a silicon oxide (SiOx), and/or a silicon oxynitride (SiOxNy).

The first data conductive layer is disposed on the first interlayer insulating layer 143, and the first data conductive layer includes wires 151, 152, 153, 154, 155, 156, 127-2, 172-2, 172-3, 173-2, and 179 extending in the first direction, and a plurality of connecting members 174, 175, 176, and 177. The first data conductive layer may include aluminum (Al), platinum (Pt), palladium (Pd), silver (Ag), magnesium (Mg), gold (Au), nickel (Ni), neodymium Nd, iridium (Ir), chromium (Cr), nickel (Ni), calcium (Ca), molybdenum (Mo), titanium (Ti), tungsten (W), copper (Cu), and/or the like, and may have a single-layer structure or a multi-layered structure of one or more of the above-described materials.

Referring to FIG. 10, an upper portion of the driving transistor T1 and the storage capacitor Cst is described as follows.

The upper surface of the gate electrode G1 and the first connecting member 176 are electrically connected to each other through an opening 176C1 in the opening OP1 of the extended portion CstE of the storage line 126. Also, the first connecting member 176 is connected to the second region of the third transistor T3 through the opening 176C2. As a result, the gate electrode G1 of the driving transistor T1 and the second region of the third transistor T3 are electrically connected to each other.

The gate electrodes G2, G3, G4, G5, G6, G7, and G8 of the other transistors T2, T3, T4, T5, T6, T7, and T8, other than the gate electrode G1 of the driving transistor T1, are electrically connected to each corresponding wire positioned in the first data conductive layer.

Referring to FIG. 8 and FIG. 9, the gate electrode G2 of the second transistor T2 is electrically connected to the first scan line 151 disposed in the first data conductive layer through the opening OG2. Here, the first scan line 151 extends in the first direction (e.g., the transverse direction).

The gate electrode G3 of the third transistor T3 is disposed in the first data conductive layer, and is electrically connected to the second scan line 152 extending in the first direction through the opening OG3. The gate electrode G3 of the third transistor T3 has a structure that overlaps with the second semiconductor layer 132 twice, as it includes two protruded parts. As a result, the third transistor T3 has a structure in which the gate electrodes of two transistors are connected to each other, and the first electrode of one transistor and the second electrode of the other transistor are connected to each other (hereinafter, also referred to as a serial connected transistor structure).

The gate electrode G4 of the fourth transistor T4 is disposed in the first data conductive layer, and is electrically connected to the first initialization control line 153 extending in the first direction through the opening OG47.

The gate electrode G4 of the fourth transistor T4 is extended to an upper side, and constitutes the gate electrode G7 of the seventh transistor T7 of the pixel of a previous row. As a result, the gate electrode G7 of the seventh transistor T7 is electrically connected to the first initialization control line 153 through the opening OG47 of a next row.

The gate electrode G5 of the fifth transistor T5 is positioned on the first data conductive layer, and is electrically connected to the first light emission control line 154 extended in the first direction through the opening OG5.

The gate electrode G6 of the sixth transistor T6 is positioned on the first data conductive layer, and is electrically connected to the second light emission control line 155 extended in the first direction through the opening OG6.

The gate electrode G8 of the eighth transistor T8 is positioned on the first data conductive layer, and is electrically connected to the bias control line 156 extended in the first direction through the opening OG8. In addition, the bias voltage line 179 positioned on the first data conductive layer is electrically connected to the first region of the eighth transistor T8 of the second semiconductor layer 132 through the opening 179C.

As shown in FIG. 8 and FIG. 9, an upper structure of the input capacitor Cpr is as follows.

In the opening OP2 of the second electrode CprE2 of the input capacitor Cpr, the upper surface of the first electrode CprE1 of the input capacitor Cpr is electrically connected to the second connecting member 175 through the opening 175C1. In addition, the second connecting member 175 is connected to the second region of the driving transistor T1, the first region of the third transistor T3, and the first region of the sixth transistor T6 through the opening 175C2.

On the other hand, the second electrode CprE2 of the input capacitor Cpr is electrically connected to the third connecting member 174 through the opening 174C2, and the other side of the third connecting member 174 is electrically connected to the position between the second transistor T2 and the fourth transistor T4 from among the first semiconductor layer 131 through the opening 174C1. As a result, the second electrode CprE2 of the input capacitor Cpr receives the data voltage $V_{DATA}$ applied through the second transistor T2, or the reference voltage VREF applied through the fourth transistor T4.

The first data conductive layer further includes a fourth connecting member 177, the second initialization voltage line 127-2, the second and third driving voltage lines 172-2 and 172-3, and the second reference voltage line 173-2.

One end of the fourth connecting member 177 is electrically connected to the position between the sixth transistor T6 and the seventh transistor T7 of the second semiconductor layer 132 through the opening 177C, and the other end thereof is a part connected to anode connecting members CCR, CCG, and CCB described in more detail below. As a result, the output current of the driving transistor T1 is transmitted to the anode through the sixth transistor T6, or the initialization voltage $V_{INT}$ is transmitted to the anode through the seventh transistor T7.

The second initialization voltage line 127-2, the second and third driving voltage lines 172-2 and 172-3, and the second reference voltage line 173-2 extend in the first direction (e.g., the transverse direction).

The second initialization voltage line 127-2 is electrically connected to the second region of the seventh transistor T7 of the second semiconductor layer 132 through the opening 127C1.

The second driving voltage line 172-2 has an extended portion 172-2B, and some region from among the extended portion is electrically connected to the first region of the fifth transistor T5 of the second semiconductor layer 132 through the opening 172C3.

Among them, the third driving voltage line 172-3 is electrically connected to the storage line 126 through the opening 172-3C and a protruded portion 172-3P. In addition, the second reference voltage line 173-2 is connected to the first region of the fourth transistor T4 of the first semiconductor layer 131 through the opening 173C1. A first passivation layer 144 is formed on the first data conductive layer.

The first passivation layer 144 may include an organic insulating material, for example, such as a generally-used polymer (e.g., such as poly(methylmethacrylate) (PMMA) or polystyrene (PS)), a polymer derivative having a phenol-based group, an acryl-based polymer, an imide-based polymer, polyimide, an acryl-based polymer, and/or a siloxane-based polymer.

A second data conductive layer is disposed on the first passivation layer 144, and the second data conductive layer includes wires 171, 172-1, 173-1, and 127-1 extending in the second direction (e.g., the vertical direction). The second data conductive layer may include aluminum (Al), platinum (Pt), palladium (Pd), silver (Ag), magnesium (Mg), gold (Au), nickel (Ni), neodymium (Nd), iridium (Ir), chromium (Cr), nickel (Ni), calcium (Ca), molybdenum (Mo), titanium (Ti), tungsten (W), copper (Cu), and/or the like, and may have a single-layer structure or a multi-layered structure of one or more of the above-described materials.

The data line 171 is shown as being divided with reference numerals 171R, 171G, and 171B to distinguish the connection to the pixel circuit unit of each color.

The data lines 171R, 171G, and 171B are electrically connected to the first region of the second transistor T2 of the first semiconductor layer 131 by a data line connection 171_C disposed in the first data conductive layer. In other words, one end of the data line connection 171_C is electrically connected to the data lines 171R, 171G, and 171B through the opening 171C1, and the other end thereof is electrically connected to the first region of the second transistor T2 of the first semiconductor layer 131 through the opening 171C2. As a result, the data voltage $V_{DATA}$ is transmitted to the second transistor T2.

The first driving voltage line 172-1 is electrically connected to the second driving voltage line 172-2 through the opening 172C1, and includes a protruded portion 172-1C that is electrically connected to the protruded portion 172-3P of the third driving voltage line 172-3 through the opening 172C2. The storage line 126 is electrically connected to the third driving voltage line 172-3 through the opening 172-3C, so the driving voltage ELVDD is also applied to the storage line 126.

The first reference voltage line 173-1 is electrically connected to the second reference voltage line 173-2 through the opening 173C2, and the first initialization voltage line 127-1 is electrically connected to the second initialization voltage line 127-2 through the opening 127C2.

As described above, the voltage lines, for example, such as the driving voltage line, the reference voltage line, and the initialization voltage line, have a mesh structure including the wiring extended in the first direction and the wiring extended in the second direction, so the voltage level does not drop at a certain position from among the wide display panels.

In addition, the second data conductive layer further includes the anode connecting members CCR, CCG, and CCB, and one end of the anode connecting members CCR, CCG, and CCB is connected to the fourth connecting member 177 through openings DCR, DCG, and DCB. The other end of the anode connecting members CCR, CCG, and CCB is connected to the anode positioned at the upper portion through the openings CTR, CTG, and CTB.

A second passivation layer 145 covering the second data conductive layer is disposed. The second passivation layer 145 may include an organic insulating material, for example, such as a generally-used polymer (e.g., such as poly(methylmethacrylate) (PMMA) or polystyrene (PS)), a polymer derivative having a phenol-based group, an acryl-based polymer, an imide-based polymer, polyimide, an acryl-based polymer, and/or a siloxane-based polymer.

In the above, the pixel circuit units PXR, PXG, and PXB have been described in more detail.

A cross-sectional structure of the light-emitting element unit is described in more detail with reference to FIG. 11.

FIG. 11 is a cross-sectional view of a display panel according to an embodiment.

Referring to FIG. 11, the cross-sectional connection structure of the anode AEB and the anode connecting member CCB of the blue pixel is shown.

The fourth connecting member 177 that is disposed on the first interlayer insulating layer 143 is exposed by an opening DCB formed in the first passivation layer 144. The anode connecting member CCB is connected to the exposed fourth connecting member 177. Also, the upper surface of the anode connecting member CCB is exposed by the opening CTB disposed in the second passivation layer 145, and the anode AEB is electrically connected to the exposed anode connecting member CCB.

Referring to FIG. 8, the anode connecting members CCR, CCG, and CCB have different shapes and lengths from one another to be connected to various suitable positions as the position of the anode changes.

Referring again to FIG. 11, a partition wall 250 having an opening 255 exposing the anode AEB is formed on the anode AEB. The opening 255 of the partition wall 250 is formed along an outline of the anode AEB, and the opening 255 is positioned inside (e.g., within) the outline of the anode AEB, thereby forming a structure in which the partition wall 250 overlaps with a part of the anode AEB.

An emission layer LEL is disposed on the anode AEB in the opening 255 of the partition wall 250, and a cathode CE covering the partition wall 250 and the emission layer LEL is disposed. The anode AEB, the emission layer LEL, and the cathode CE are combined to form the light emitting diode (LED).

An encapsulation layer 300 may be further included on the cathode CE to prevent or substantially prevent moisture and/or air from being transferred from the outside to the emission layer LEL. The emission layer LEL may be an inorganic emission layer or an organic emission layer. In the case of the organic emission layer, the encapsulation layer 300 may be important, because the organic emission layer may be vulnerable to moisture and/or air. According to an embodiment, the encapsulation layer 300 may include an inorganic layer and an organic layer, and the inorganic layer and the organic layer may be alternately stacked on one another a plurality of times (e.g., several times), or may include a triple layered structure of an inorganic layer/organic layer/inorganic layer.

With reference to FIG. 8 to FIG. 11 above, one or more embodiments have been described in which the first initialization voltage line 127-1 from among the wirings extending in the second direction (e.g., the vertical direction) such as the data line is used as the common voltage line CSL. However, the present disclosure is not limited thereto, and the common voltage line CSL is not limited thereto.

Hereinafter, another modified embodiment is described with reference to FIG. 12.

Figure 12:
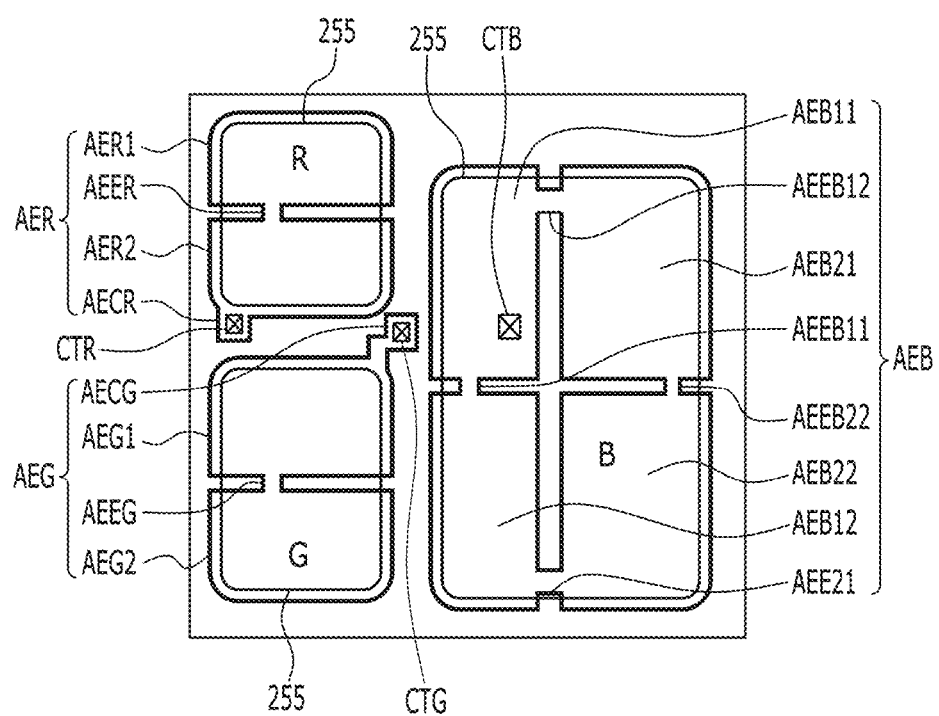
FIG. 12 is a view showing an anode structure in a pixel according to another embodiment.

FIG. 12 is a view showing an anode structure in a pixel according to another embodiment.

In the embodiment of FIG. 12, the anode AEB of the blue pixel is divided in a direction that is not parallel to or substantially parallel to the data line 171B corresponding to the anode AEB of the blue pixel. As a result, an opening extending in the first direction (e.g., the transverse direction) that is not parallel to or substantially parallel to the data line 171B is also included.

Also, the anode AER of the red pixel and the anode AEG of the green pixel are divided along the first direction (e.g., the transverse direction). As a result, openings extending in the first direction (e.g., the transverse direction) is included in the anode AER of the red pixel and the anode AEG of the green pixel, respectively.

Each of the anodes AER, AEG, and AEB may include the opening (particularly, the opening formed in the first direction that is not parallel to or substantially parallel to the data line), such that a gas may be discharged to the outside without blocking the gas in a case that the gas is discharged due to a baking process and/or the like when the second passivation layer 145 positioned under the anodes AER, AEG, and AEB is formed by using an organic material.

In other words, the partition wall 250 including the opening 255 exposing each of the anodes AER, AEG, and AEB is formed, and may include a part where the anodes AER, AEG, and AEB are not formed in the opening 255 of the partition wall 250.

Here, the part of the partition wall 250 in which the anodes AER, AEG, and AEB are not formed may extend in a direction crossing the extension direction of the data line.

A detailed structure of each anode is described in more detail hereinafter.

The anode AER of the red pixel includes an anode AER1 of a first red pixel, an anode AER2 of a second red pixel, and an anode connection AEER connecting the anodes AER1 and AER2 of the first and second red pixels to each other. Further, the anode AER of the red pixel also includes a contact portion AECR, and an opening CTR to be connected to the red pixel circuit unit PXR. The contact portion AECR of the anode AER of the red pixel is connected to the anode connecting member CCR (e.g., refer to FIG. 8) through the opening CTR disposed in the second passivation layer 145.

The anode AER of the red pixel includes the anode AER1 of the first red pixel, the anode AER2 of the second red pixel, and the anode connection AEER connecting the anode AER1 of the first red pixel and the anode AER2 of the second red pixel to each other, and thus, there is a part where the anode AER of the red pixel is not formed on some region. For example, as shown in FIG. 12, the anode AER of the red pixel is not disposed at a part from among the anode AER of the red pixel that is exposed through the opening 255 of the partition wall 250. The gas may be discharged through the part where the anode AER of the red pixel is not formed, and the part where the anode AER of the red pixel may not extend in the vertical direction (e.g., the second direction) such as the data line. However, according to an embodiment, in the case of reducing the parasitic capacitance of the data line overlapping with the anode AER of the red pixel, the portion where the anode AER of the red pixel is not formed may be parallel to or substantially parallel to the data line, and does not overlap with the data line.

The anode AEG of the green pixel includes an anode AEG1 of a first green pixel, an anode AEG2 of a second green pixel, and an anode connection AEEG connecting the anode AEG1 of the first green pixel and the anode AEG2 of the second green pixel to each other. Further, the anode AEG of the green pixel also includes a contact portion AECG, and an opening CTG to be connected to the green pixel circuit unit PXG. The contact portion AECG of the anode AEG of the green pixel is connected to the anode connecting member CCG (e.g., refer to FIG. 8) through the opening CTG disposed in the second passivation layer 145.

The anode AEG of the green pixel includes the anode AEG1 of the first green pixel, the anode AEG2 of the second green pixel, and the anode connection AEEG connecting the anode AEG1 of the first green pixel and the anode AEG2 of the second green pixel to each other, thereby including a part where the anode AEG of the green pixel is not formed on some region. For example, as shown in FIG. 12, the anode AEG of the green pixel is not disposed at a part from among the anode AEG of the green pixel that is exposed through the opening 255 of the partition wall 250. The gas may be discharged through the portion where the green pixel anode AEG is not formed, and the portion where the green pixel anode AEG is not formed may not extend in the vertical direction (e.g., the second direction) like the data line. However, according to an embodiment, in order to reduce the parasitic capacitance of the data line overlapping with the anode AEG of the green pixel, the portion where the anode AEG of the green pixel is not formed may be parallel to or substantially parallel to the data line, and may not overlap with the data line.

The blue pixel anode AEB includes a region (e.g., an opening) in which the anode AEB of the blue pixel is not formed in the second direction (e.g., the vertical direction) parallel to or substantially parallel to the data line, and includes a region (e.g., an opening) in which the anode AEB of the blue pixel is not formed like the anodes AER and AEG of the red and green pixels even in the first direction (e.g., the transverse direction).

For example, the anode AEB of the blue pixel includes anodes AEB11, AEB12, AEB21, and AEB22 of first to fourth blue pixels, and anode connections AEEB11, AEEB12, AEEB21, and AEEB22 to connect them with each other. Also, the anode AER of the red pixel includes an opening CTB to be connected to the red pixel circuit unit PXR. In other words, the anode AEB of the blue pixel is the anode connecting member CCB (e.g., refer to FIG. 8) through the opening CTB positioned at the second passivation layer 145. In the embodiment of FIG. 12, the anode AEB of the blue pixel has a structure that is directly connected at the anode AEB11 of the first blue pixel without forming the contact portion. However, according to an embodiment, they may be connected to each other through the contact portion.

The anode AEB of the blue pixel has four anode connections AEEB11, AEEB12, AEEB21, and AEEB22 connecting the anodes AEB11, AEB12, AEB21, and AEB22 of the first to fourth blue pixels to each other, thereby including a part where the anode AEB of the blue pixel is not formed on some region. For example, as shown in FIG. 12, the anode AEB of the blue pixel is not disposed at a part from among the anode AEB of the blue pixel that is exposed through the opening 255 of the partition wall 250. The gas may be discharged through the portion where the anode AEB of the blue pixel is not formed, and some of the portion where the anode AEB of the blue pixel is not formed extends in the vertical direction (e.g., the second direction) like the data line, and may not overlap with the data line in a plan view. In this way, the blue pixel anode AEB does not overlap with the data line in a plan view, thereby reducing the parasitic capacitance occurring in the data line, and enabling high-speed driving.

Also, like the embodiment of FIG. 4 and FIG. 5, the additional parasitic capacitance does not occur in the anode AEB of the blue pixel where the parasitic capacitance is largely generated by preventing the anode AEB of the blue pixel and the common voltage line CSL from overlapping with each other, so that a relatively small parasitic capacitance may be generated. As a result, the small parasitic capacitance is indirectly generated in the data line, so that the entire display device may be driven at a high speed.

Here, referring to FIG. 8, the common voltage line CSL is the voltage line for applying the voltage to the pixel circuit unit, and may be the first initialization voltage line 127-1, but the present disclosure is not limited thereto, and another first reference voltage line 173-1 may be used. For example, in another embodiment, the common voltage line CSL may be the first driving voltage line 172-1. Further, while the embodiment of FIG. 8 shows that the bias voltage line 179 extends in the first direction (e.g., the transverse direction), according to an embodiment, the bias voltage line 179 may extend in the same second direction (e.g., the vertical direction) as that of the data line. In this case, the bias voltage line 179 may also be the common voltage line CSL, and may not overlap with the anode AEB of the blue pixel.

Figure 13:
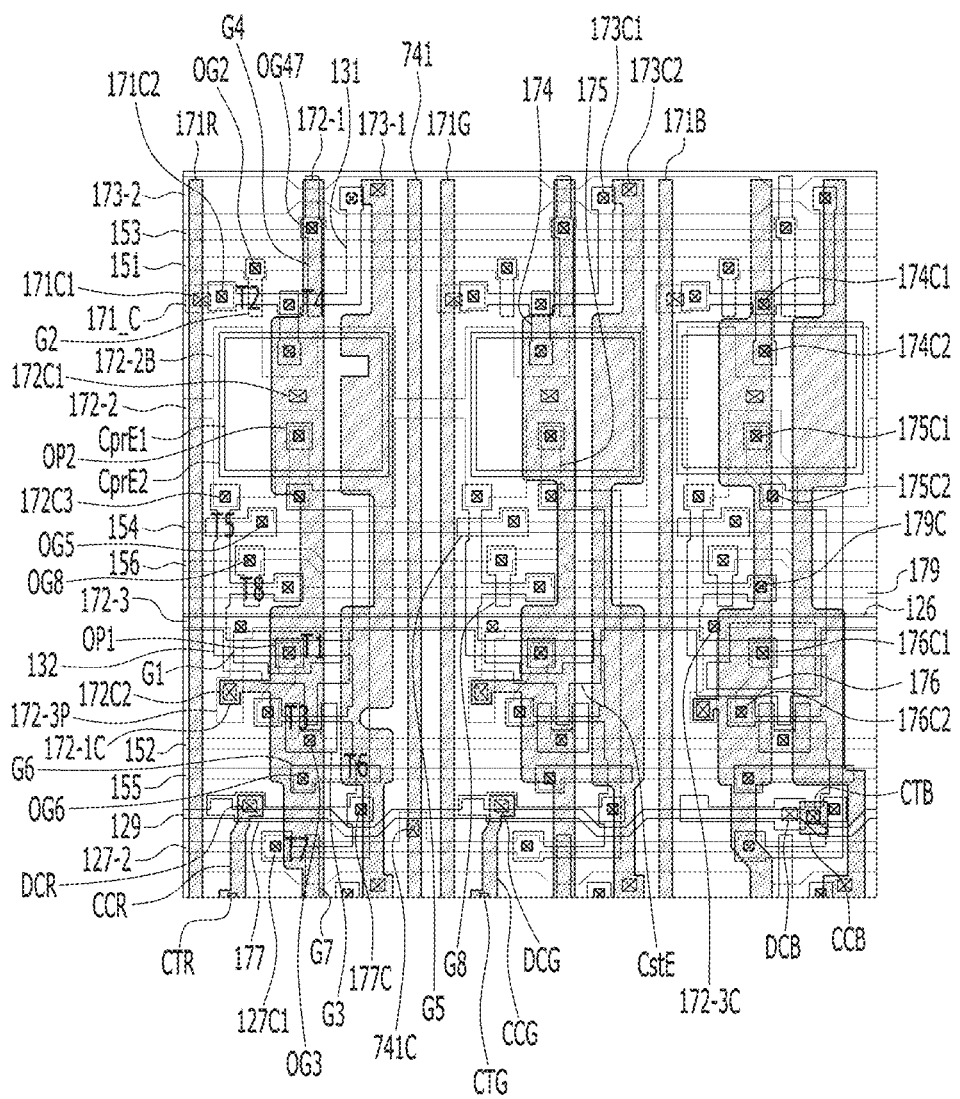
FIG. 13 is a layout view of a pixel according to another embodiment.

In addition, according to an embodiment, the driving low voltage line, which is another wire extended in the extending direction (e.g., the vertical direction or the second direction) of the data line, may be the common voltage line CSL. In FIG. 13, an embodiment in which the driving low voltage line is the common voltage line CSL is illustrated.

FIG. 13 is a layout view of a pixel according to another embodiment.

FIG. 13 illustrates a modified structure of FIG. 8, in which the driving low voltage line 741 is formed in FIG. 13 at a position of the first initialization voltage line 127-1 in FIG. 8. The driving low voltage line 741 is a longitudinal wire formed to transmit the driving low voltage ELVSS to the cathode CE, and may further include an additional driving low voltage line extending in a horizontal direction according to an embodiment.

The driving low voltage line 741 is electrically connected to the cathode CE disposed upward through the opening 741C.

The driving low voltage line 741, like the common voltage line CSL of FIG. 4 and FIG. 5, may be formed at a position that does not overlap with the anode AEB of the blue pixel in a plan view. As a result, the parasitic capacitance due to the driving low voltage line 741 is reduced on the anode AEB of the blue pixel. Accordingly, from among the parasitic capacitances occurring in the data line 171B, the parasitic capacitance due to the anode AEB of the blue pixel is also reduced. In other words, the parasitic capacitance of the data line 171B indirectly decreases because the anode AEB of the blue pixel and driving low voltage line 741, which is the common voltage line CSL, do not overlap with each other. As a result, the RC delay value generated in the data line 171B is reduced, and the high-speed driving is enabled.

In the above description, although the structure of FIG. 8 and the structure of FIG. 13 have been separately described as different embodiments, according to an embodiment, the structures of FIG. 8 and FIG. 13 may be included together in the same embodiment.

In other words, in one pixel row of one display device, the structure of FIG. 8 and the structure of FIG. 13 may be included together, and in six adjacent pixel circuit units, one set of adjacent three pixel circuit units PXR, PXG, and PXB may have the structure of FIG. 8 and another set of adjacent three pixel circuit units PXR, PXG, and PXB may have the structure of FIG. 13. In this case, the first initialization voltage line 127-1 applies the initialization voltage VINT to the adjacent six pixel circuit units, and the driving low voltage ELVSS applied to the cathode CE of the adjacent six pixel circuit units may be applied by the driving low voltage line 741. In this embodiment, the first initialization voltage line 127-1 and the driving low voltage line 741 may have a structure that is disposed every six pixel circuit units PXR, PXG, and PXB, and extends in the second direction (e.g., the vertical direction).

However, according to an embodiment, the first initialization voltage line 127-1 or the driving low voltage line 741 may be disposed for a larger number of pixel circuit units than the six adjacent pixel circuit units PXR, PXG, and PXB, so that at least three continuous pixel circuit units PXR, PXG, and PXB, in which the first initialization voltage line 127-1 and the driving low voltage line 741 are not included, may be formed.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

| Description of Symbols | |
|---|---|
| AER, AEG, AEB: anode | 171, 171R, 171G, 171B: data line |
| PXR, PXG, PXB: pixel circuit unit | LED: light emitting diode (LED) |
| CSL: common voltage line | PXU: unit pixel |
| AECG, AECR, AECR: contact portion | |
| $V_{DATA}$: data voltage | $V_{INT}$: initialization voltage |
| $V_{REF}$: reference voltage | Vbias: bias voltage |
| LEL: emission layer | CE: cathode |
| 110: substrate | 126: storage line |
| 127, 127-1, 127-2: initialization voltage line | 129: repair line |
| 131, 132: semiconductor layer | 141, 142: first gate insulating layer |
| 143: first interlayer insulating layer | 144, 145: first passivation layer |
| 151, 152: scan line | 153. 153-1 : initialization control line |
| 154, 155: light emission control line | 156: bias control line |
| 172, 172-1, 172-2, 172-3: driving voltage line | |
| 173, 173-1, 173-2: reference voltage line | 179: bias voltage line |
| 741: driving low voltage line | |
| 174, 175, 176, 177: connecting member | |
| 250: partition wall | 300: the encapsulation layer |
| 171_C: data line connection | 172-1C: protruded portion |
| 172-2B: extended portion | 172-3P: protruded portion |
| CCR, CCG, CCB: anode connecting member | |
| OP1, OP2: opening | |
| Cpr: input capacitor | Cst: storage capacitor |
| AEB3, AEER, AEEG, AEEB11, AEEB12, AEEB21, AEEB22: anode connection | |
| G1, G2, G3, G4, G5, G6, G7, G8: gate electrode | |
| T1, T2, T3, T4, T5, T6, T7, T8: transistor | |
| 127C1, 127C2, 171C1, 171C2, 172-3C, 172C1, 172C2, 172C3: opening | |
| 173C1, 173C2, 174C1, 174C2, 175C1, 175C2, 176C1, 176C2: opening | |
| 177C, 179C, 255, 741C: opening | |
| CTR, CTG, CTB, DCR, DCG, DCB: opening | |
| OG2, OG3, OG47, OG5, OG6, OG8: opening | |

What is claimed is:

1. A light emitting diode display device comprising:
a first pixel circuit, a second pixel circuit, and a third pixel circuit;
a first data line connected to the first pixel circuit to transmit a first data voltage and extending in a first direction;
a first light-emitting element comprising a first anode, a cathode, and a first emission layer between the first anode and the cathode;
a second light-emitting element comprising a second anode, the cathode, and a second emission layer between the second anode and the cathode; and
a third light-emitting element comprising a third anode, the cathode, and a third emission layer between the third anode and the cathode,
wherein the first anode comprises a first portion, and a second portion,
wherein the first data line is disposed between the first portion and the second portion of the first anode in a plan view, and
wherein the second light-emitting element and the third light-emitting element are disposed along the first direction.

2. The light emitting diode display device of claim 1, wherein the first anode further comprises at least one connection connecting the first portion and the second portion.

3. The light emitting diode display device of claim 2, wherein the first data line overlaps one of the at least one connection in a plan view.

4. The light emitting diode display device of claim 3, wherein the at least one connection extends in a second direction crossing the first direction.

5. The light emitting diode display device of claim 1, wherein the first portion and the second portion have different areas from each other.

6. The light emitting diode display device of claim 1, wherein the first data line does not overlap with the first portion and the second portion in a plan view.

7. The light emitting diode display device of claim 1, wherein the first light-emitting element corresponds to a blue pixel, the second light-emitting element corresponds to a red pixel and the third light-emitting element corresponds to a green pixel.

8. The light emitting diode display device of claim 7, wherein the second anode and the third anode do not have any connection.

9. The light emitting diode display device of claim 1, further comprising a partition wall having openings exposing at least a part of the first anode, at least a part of the second anode, and at least a part of the third anode.

10. The light emitting diode display device of claim 9, wherein the first anode further comprises an open area extending in the first direction.

11. The light emitting diode display device of claim 1, further comprises:
a second data line connected to the second pixel circuit to transmit a second data voltage and extending in the first direction, and
a third data line connected to the third pixel circuit to transmit a third data voltage and extending in the first direction.

12. The light emitting diode display device of claim 11, wherein each of the first pixel circuit, the second pixel circuit, and the third pixel circuit comprises:
a driving transistor configured to transmit an output current to a corresponding anode from among the first anode, the second anode, and the third anode;
a capacitor; and
a second transistor connected to a corresponding data line from among the first data line, the second data line and the third data line, and configured to transmit a corresponding data voltage to a gate electrode of the driving transistor.

13. The light emitting diode display device of claim 12, wherein the capacitor is located between the gate electrode of the driving transistor and an output electrode of the second transistor, and
wherein the corresponding data voltage is transmitted to the gate electrode of the driving transistor through the capacitor.

14. The light emitting diode display device of claim 13, further comprising
a reference voltage line, a driving voltage line, a bias voltage line, a driving low voltage line, and an initialization voltage line,
wherein:
the reference voltage line is configured to transmit a reference voltage to a node at which the capacitor and the second transistor are connected to each other;
the driving voltage line is configured to transmit a driving voltage to the driving transistor;
the bias voltage line is configured to transmit a bias voltage to the driving transistor;
the driving low voltage line is configured to transmit a driving low voltage to the cathode; and
the initialization voltage line is configured to transmit an initialization voltage to the first anode, the second anode, and the third anode.

15. The light emitting diode display device of claim 14, wherein each of the first pixel circuit, the second pixel circuit, and the third pixel circuit further comprises:
a third transistor connected to the gate electrode of the driving transistor and an output electrode of the driving transistor.

16. The light emitting diode display device of claim 14, wherein each of the first pixel circuit, the second pixel circuit, and the third pixel circuit further comprises:
a storage capacitor connected to the gate electrode of the driving transistor and the driving voltage line.

17. The light emitting diode display device of claim 14, wherein each of the first pixel circuit, the second pixel circuit, and the third pixel circuit further comprises:
a fourth transistor connected to the output electrode of the second transistor and the reference voltage line.

18. The light emitting diode display device of claim 14, wherein each of the first pixel circuit, the second pixel circuit, and the third pixel circuit further comprises:
a fifth transistor connected to an input electrode of the driving transistor and the driving voltage line.

19. The light emitting diode display device of claim 14, wherein each of the first pixel circuit, the second pixel circuit, and the third pixel circuit further comprises:
a sixth transistor connected to an output electrode of the driving transistor and a corresponding anode from among the first anode, the second anode and the third anode.

20. The light emitting diode display device of claim 19, wherein each of the first pixel circuit, the second pixel circuit, and the third pixel circuit further comprises:

a seventh transistor connected to the corresponding anode and the initialization voltage line.

\* \* \* \* \*